United States Patent [19]
Glick et al.

[11] Patent Number: 5,823,027
[45] Date of Patent: *Oct. 20, 1998

[54] ELECTRICAL/MECHANICAL ACCESS CONTROL SYSTEMS AND METHODS

[75] Inventors: Mark M. Glick, Dallas; Nicholas M. G. Fekete, Richardson; Michael L. Bolan, Dallas; Jeffrey D. Owens, Whitesboro, all of Tex.

[73] Assignee: Dallas Semiconductor Corporation, Dallas, Tex.

[*] Notice: The term of this patent shall not extend beyond the expiration date of Pat. No. 5,715,714.

[21] Appl. No.: 483,780

[22] Filed: Jun. 7, 1995

Related U.S. Application Data

[60] Division of Ser. No. 346,556, Nov. 29, 1994, which is a continuation-in-part of Ser. No. 220,425, Nov. 30, 1994, abandoned.

[51] Int. Cl.$^6$ ..................................................... E05B 49/00
[52] U.S. Cl. ................................. 70/278; 70/263; 70/279
[58] Field of Search ............................ 70/263, 276–279; 292/341.16; 340/825.31, 825.32, 825.34

[56] References Cited

U.S. PATENT DOCUMENTS

| | | | |
|---|---|---|---|
| 4,712,398 | 12/1987 | Clarkson | 70/276 |
| 4,727,369 | 2/1988 | Rode | 340/825.31 |
| 4,833,465 | 5/1989 | Abend | 70/279 |
| 4,922,736 | 5/1990 | Tanaka | 70/277 |
| 5,035,450 | 7/1991 | Muller | 292/341.16 |
| 5,219,386 | 6/1993 | Kletzmaier | 70/277 |
| 5,337,043 | 8/1994 | Gokcebay | 340/825.31 |
| 5,437,174 | 8/1995 | Aydin | 70/278 |
| 5,474,342 | 12/1995 | Smith | 292/341.16 |
| 5,484,180 | 1/1996 | Helmar | 292/341.16 |
| 5,490,699 | 2/1996 | Uyeda | 292/341.16 |

Primary Examiner—Rodney M. Lindsey
Assistant Examiner—Gary Estremsky
Attorney, Agent, or Firm—Jenkens & Gilchirst, P.C

[57] ABSTRACT

A retrofit electromechanical door knob assembly is adapted to fit within an aperture in a door in place of a conventional mechanical lock assembly. The retrofit door knob assembly is similar in appearance to a conventional door handle assembly, but includes a motor coupled to a latch, and suitable electrical and mechanical key inserts for receiving separate electrical and mechanical keys. Either a mechanical or an electrical key can unlock the latch. The electrical key insert includes a data probe within the handle for receiving the electrical key and a means for gripping an electronic key to allow a user to turn the handle with the key after the latch is unlocked by the motor, thereby withdrawing the latch.

2 Claims, 34 Drawing Sheets

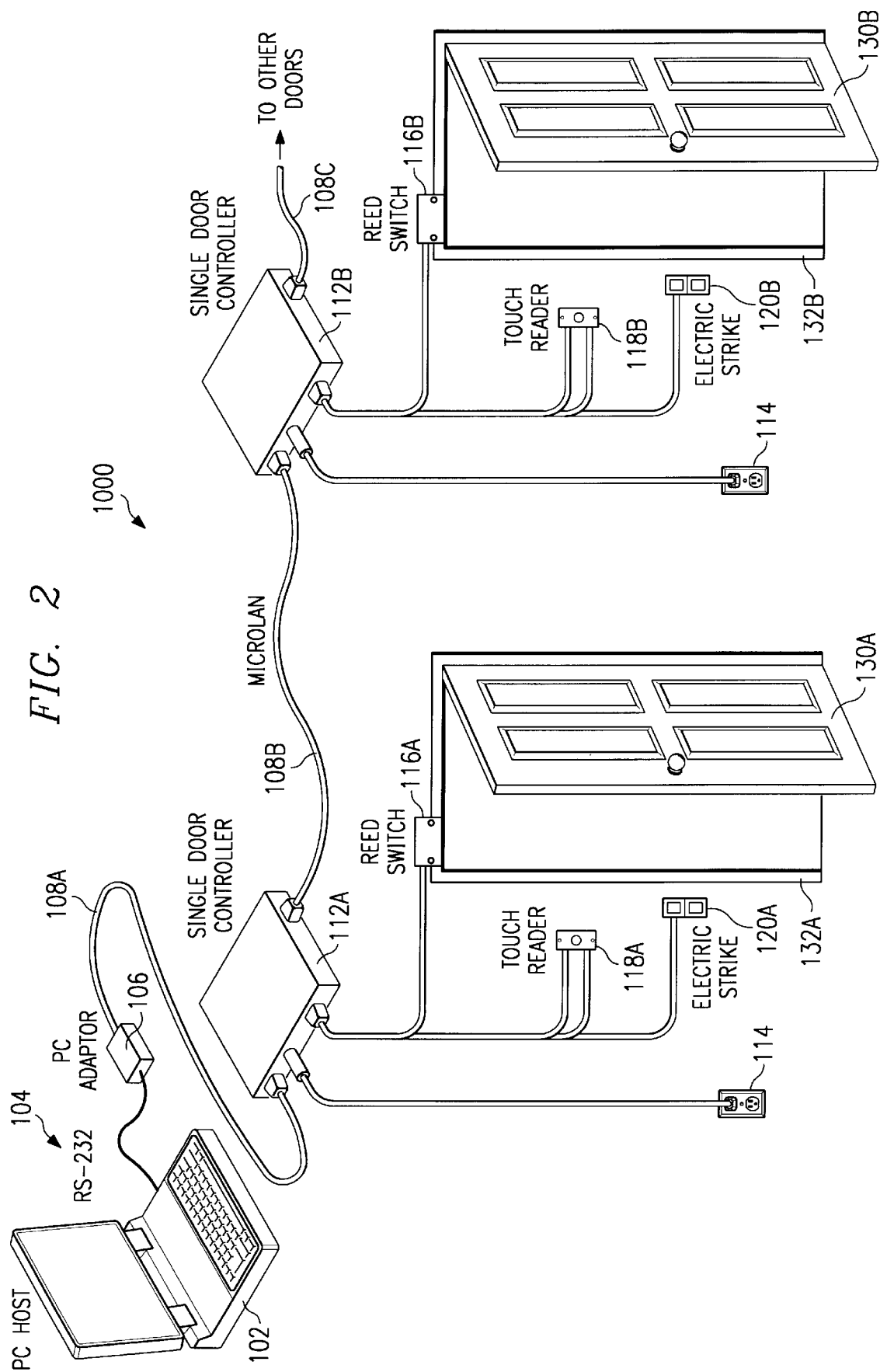

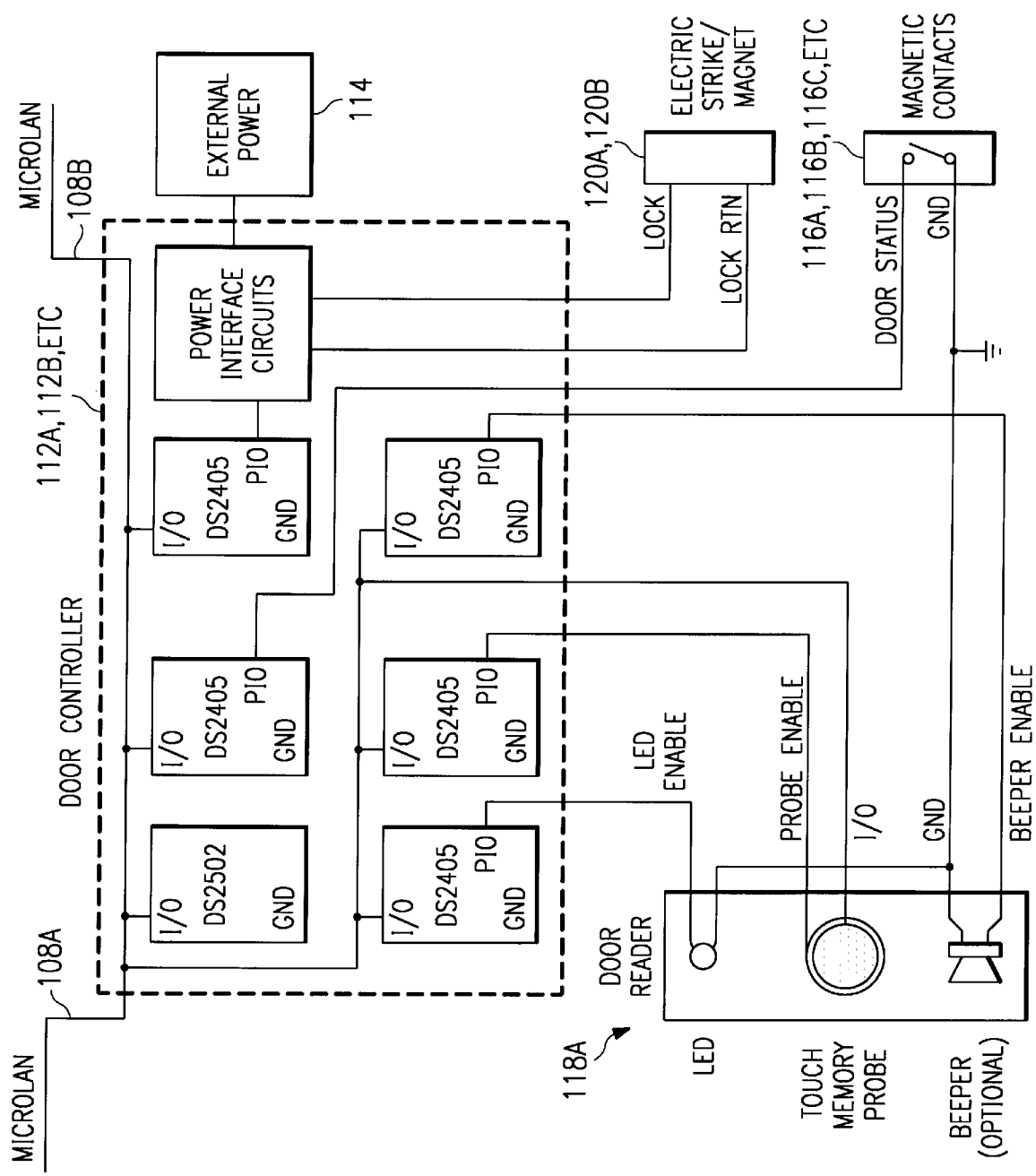

FIG. 4A
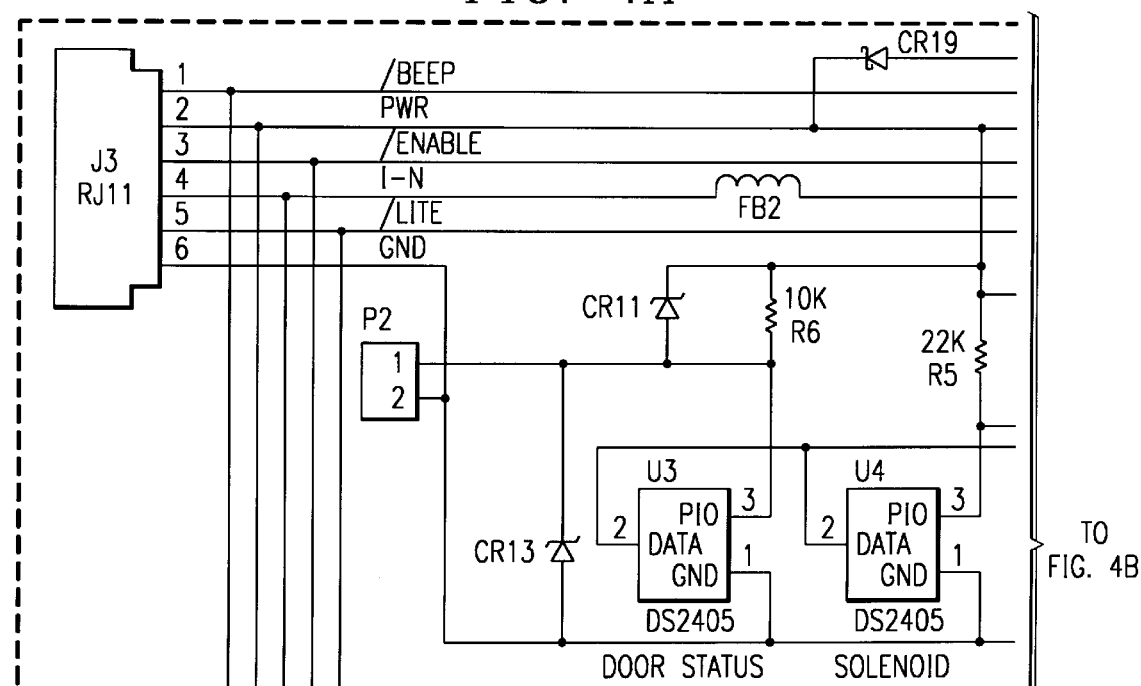
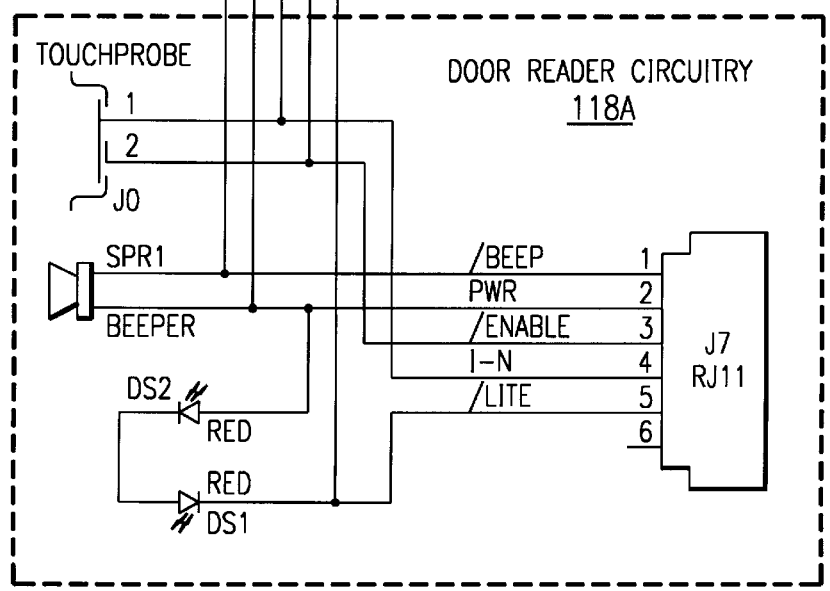

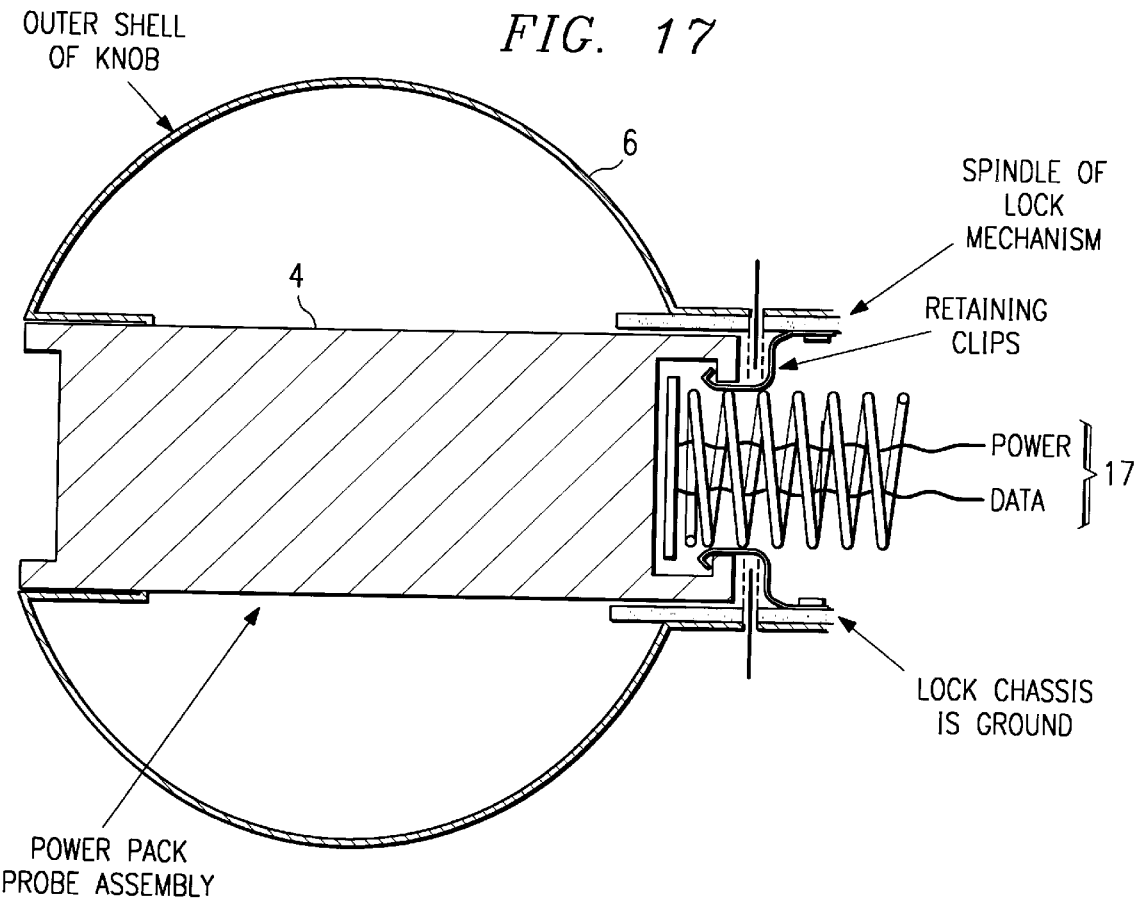
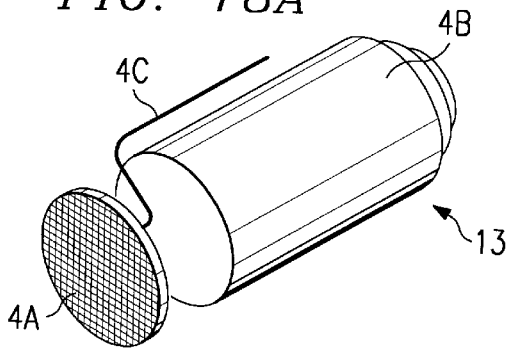
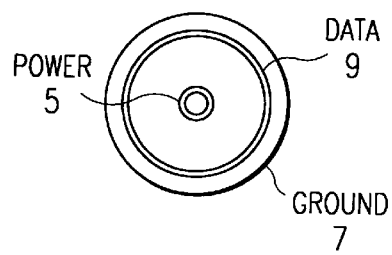
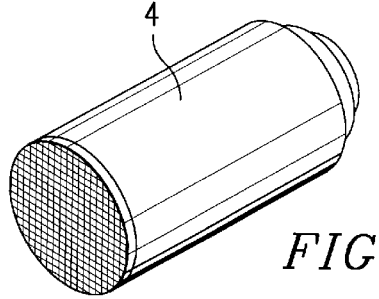

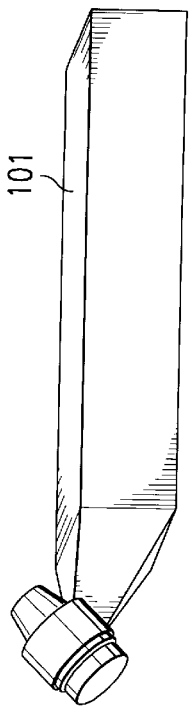
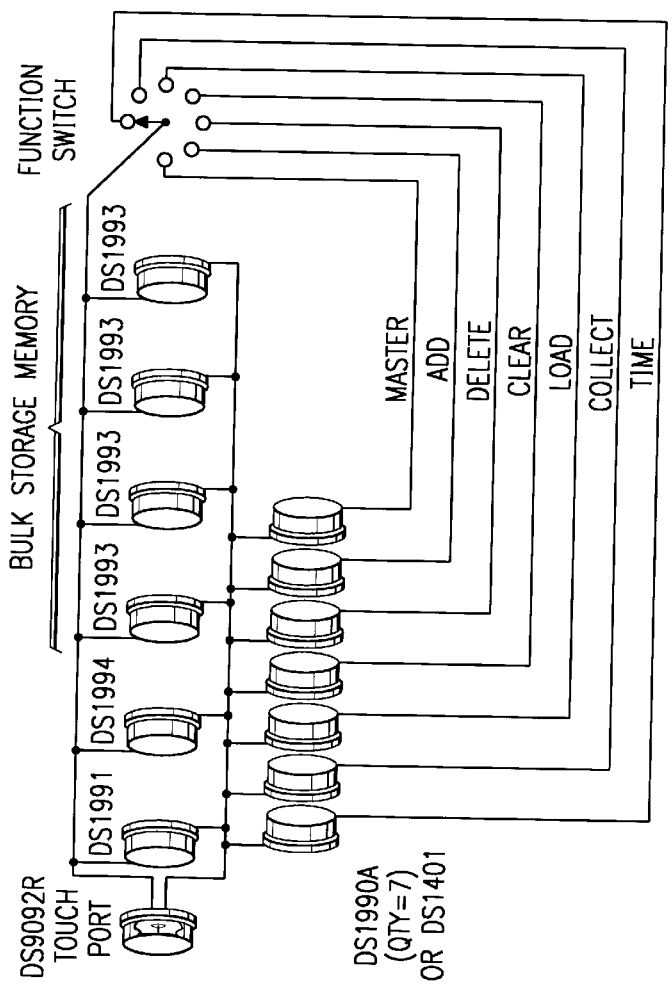
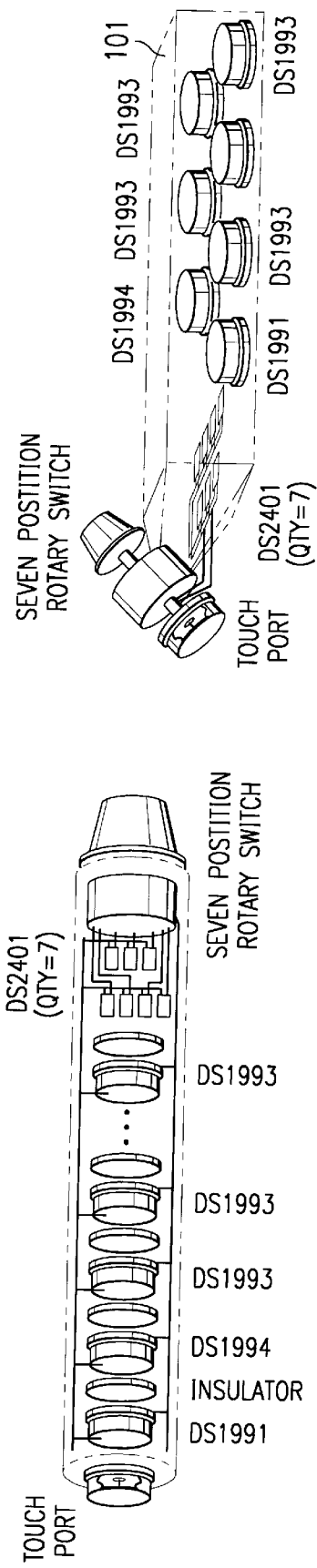
FIG. 22

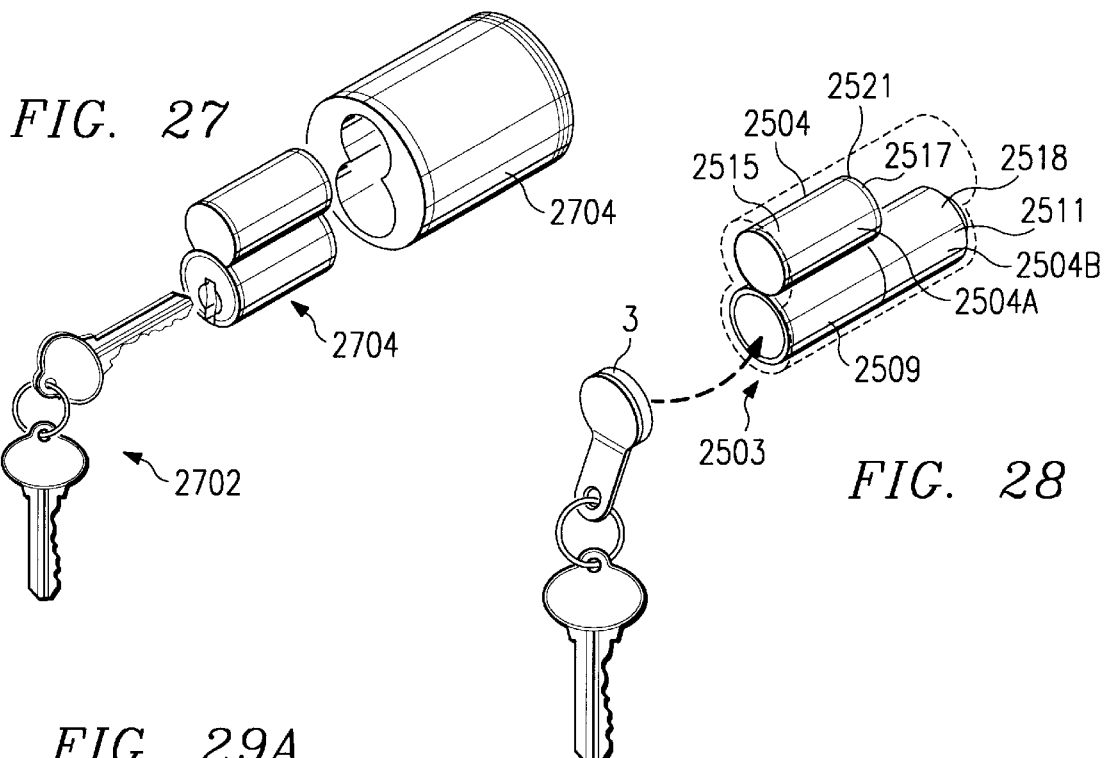
FIG. 27
FIG. 28
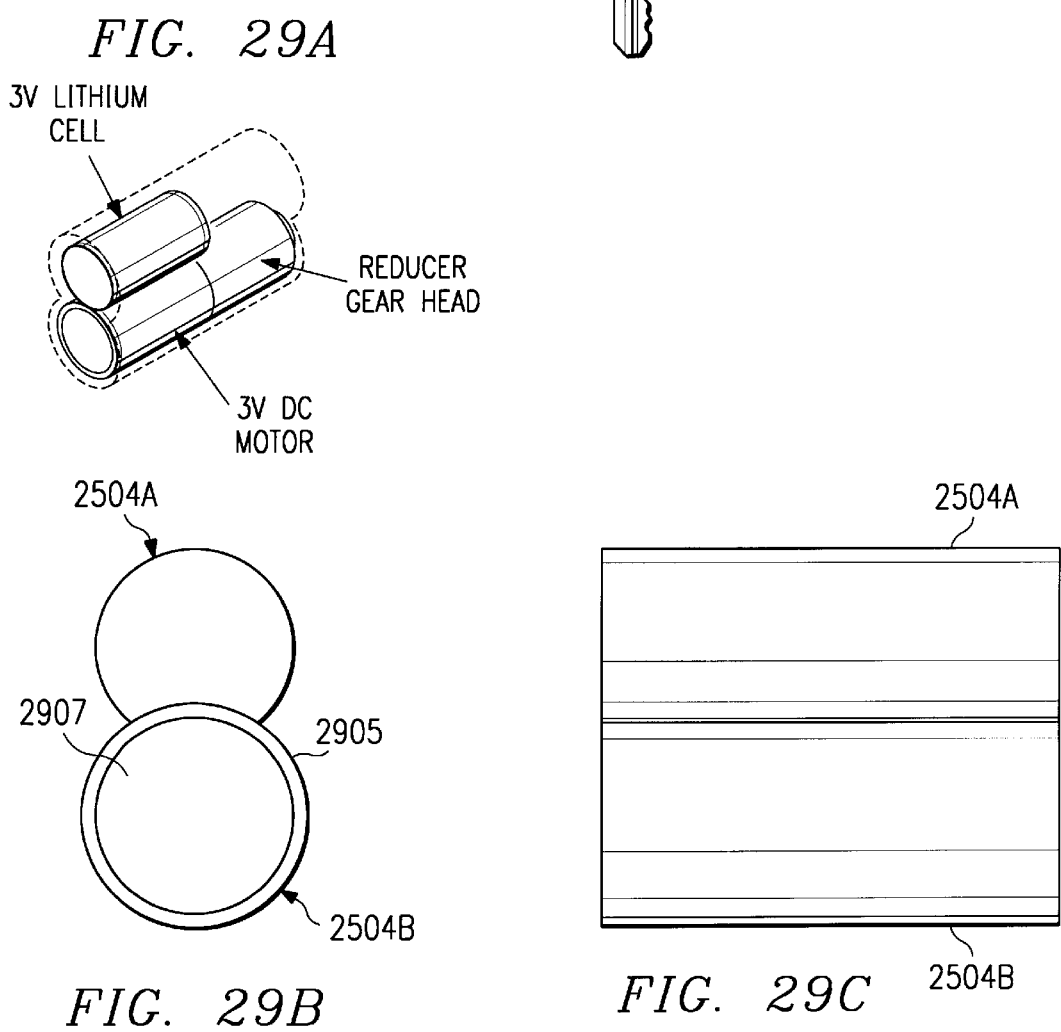
FIG. 29A
FIG. 29B
FIG. 29C

FIG. 35
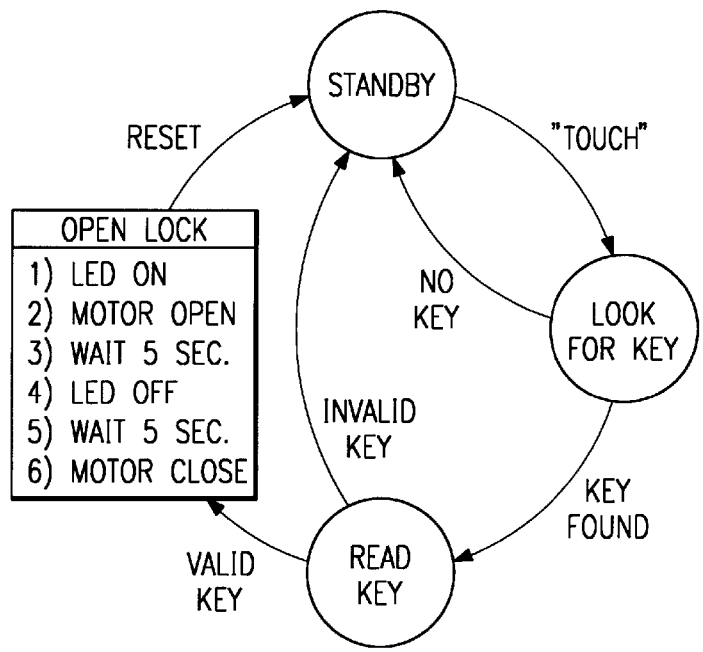
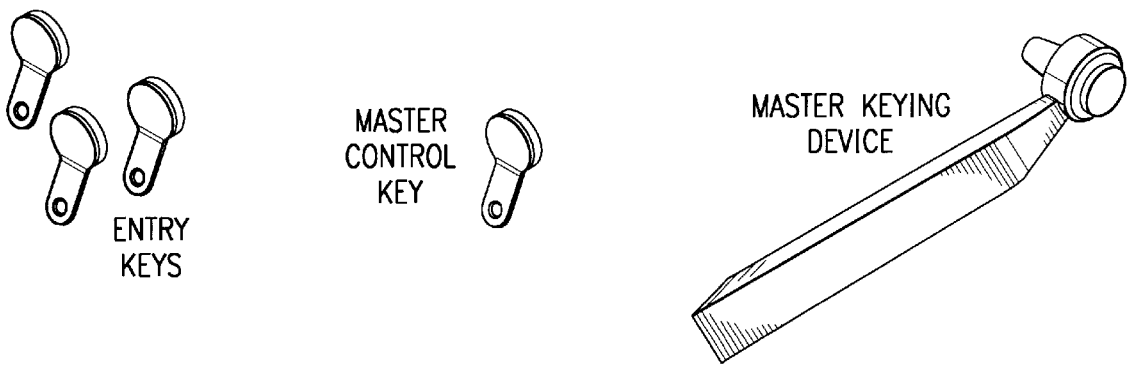

LEVER CONTENTS
1) TOUCH PROBE
2) LOCK PROCESSOR CHIP
3) MOTOR
4) TORQUE CONVERTER
5) LITHIUM CELL

KNOB CONTENTS
1) TOUCH PROBE
2) LOCK PROCESSOR CHIP
3) MOTOR
4) TORQUE CONVERTER
5) LITHIUM CELL

ELECTRICAL/MECHANICAL ACCESS CONTROL SYSTEMS AND METHODS

This application is a Divisional application of U.S. patent application Ser. No. 08/346,556 filed Nov. 29, 1994, which is a Continuation-In-Part application of U.S. patent application Ser. No. 08/220,425 filed Mar. 30, 1994, now abandoned.

PARTIAL WAIVER OF COPYRIGHT PURSUANT TO 1077 O.G. 22(Mar. 20, 1987)

© Copyright, Dallas Semiconductor Corporation 1994. All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the owner of the copyright and maskwork rights has no objection to the facsimile reproduction by anyone of the patent document or patent disclosure, as it appears in the United States Patent and Trademark Office patent file or records, but otherwise reserves all copyright and maskwork rights whatsoever.

CROSS-REFERENCE TO RELATED APPLICATIONS

This application hereby incorporates by reference the following co-assigned issued patents and patent applications:

| U.S. Pat. No. | Filing Date/ Issue Date | DSC Case No. | Authors |
|---|---|---|---|
| 4,862,310 | 04-29-88/08-29-89 | DSC-77 | Harrington |
| 5,210,846 | 05-15-89/05-11-93 | DSC-83 | Lee |
| 08/019,932 | 02-19-93 | DSC-83A | Lee |
| 4,982,371 | 05-15-89/01-01-91 | DSC-85 | Lee et al. |
| 07/632,227 | 12-20-90 | DSC-85A | Lee et al. |
| 5,091,771 | 05-15-89/11-18-91 | DSC-86 | Bolan et al. |
| 4,972,377 | 05-15-89/11-20-90 | DSC-107 | Lee |
| 5,191,554 | 08-27-91/03-02-93 | DSC-107A | Lee |
| 5,181,091 | 09-16-91/01-19-93 | DSC-153A | Harrington et al. |
| 4,945,217 | 05-15-89/07-31-90 | DSC-157 | Bolan |
| 5,025,141 | 07-17-90/06-18-91 | DSC-157A | Bolan |
| 4,948,954 | 05-15-89/08-14-90 | DSC-158 | Dias |
| 4,983,820 | 08-14-90/01-08-91 | DSC-158A | Dias |
| 5,045,675 | 05-15-89/09-03-91 | DSC-159 | Steve Curry |
| 4,995,004 | 05-15-89/02-19-91 | DSC-160 | Lee |
| 07/657,717 | 02-19-91 | DSC-160A | Lee |
| 07/725,793 | 07-09-91 | DSC-175 | Curry et al. |
| 07/998,978 | 12-30-92 | DSC-175A | Curry et al. |
| 07/527,492 | 05-22-90 | DSC-268 | Bolan et al. |
| 5,206,905 | 11-19-90/04-27-93 | DSC-303 | Lee et al. |
| 07/615,615 | 11-19-90 | DSC-304 | Lee et al. |
| 5,226,137 | 11-19-90/07-06-93 | DSC-305 | Lee et al. |
| 07/882,244 | 05-08-92 | DSC-306 | Lee |
| 07/631,929 | 12-19-90 | DSC-316 | Curry et al. |
| 07/728,230 | 07-10-91 | DSC-317 | Pearson et al. |
| 07/727,618 | 07-10-91 | DSC-319 | Williams et al. |
| 07/727,619 | 07-19-91 | DSC-322 | Rodriguez et al. |
| 07/727,638 | 07-10-91 | DSC-324 | Ni et al. |
| 08/103,724 | 08-09-93 | DSC-352 | Pearson et al. |
| 07/727,639 | 07-10-91 | DSC-353 | Bolan et al. |
| 5,166,545 | 07-10-91/11-24-92 | DSC-356 | Harrington |
| 08/022,258 | 02-24-93 | DSC-377 | Bolan et al. |
| 08/031,776 | -3-15-93 | DSC-377A | Bolan et al. |
| 08/015,506 | 02/09/93 | DSC-393 | Harrington et al. |
| 08/247,941 | | DSC-419 | |

In addition, the data sheets for the following parts manufactured by Dallas Semiconductor Corporation: DS1990, DS1991, DS1993, DS2401, DS2405, DS5001, DS1227, DS2404, and DS2502 as well as the publication entitled "50 Ways to Touch", which is published and distributed by Dallas Semiconductor.

FIELD OF INVENTION

The present invention relates generally electrical/mechanical access control systems and methods and, more particularly, but not by way of limitation, to electrical and mechanical locks.

BACKGROUND

Conventional access control systems are wired in to a central processor and, in addition being cumbersome, offer practically no linking capabilities outside a specialized access system. Moreover, in some applications, they are virtually a stand-alone system, offering very little in terms of transporting data regarding their use in and out of the locks. Thus, there is no accountability. Similarly, portable data carriers typically use mechanical or electrical keys with no memory and any other mechanism to assist in the transportation of memory.

Problems with conventional access control and security systems are probably best illustrated by mechanical and electrical door locks themselves, which are, by definition, a focal point in most any access control system that attempts to integrate with existing locking mechanisms and habit patterns of most individuals. In particular, mechanical locking systems generally use a hollow core filled with tumblers, generally between five and seven tumblers. These tumblers align themselves with a mechanical key to unlock or disable the door lock to grant or deny access to restricted areas. Similarly, electrical locking systems use electrical processors to check coded data in order to grant or deny access or lock or unlock the door lock.

Numerous problems, however, exist with existing mechanical and/or electrical locking systems. In particular, regarding mechanical locks, mechanical keys have a limited number of combinations and can be easily and repeatedly duplicated, since duplicating mechanical keys is relatively easy and virtually uncontrollable (i.e., most hardware stores make duplicates). Moreover, since the door lock is on the outside of the door, it is exposed to brutal forced override (i.e., tampering and vandalism—someone can hit the door knob with a hammer, reach through and activate this particular mechanical piece, and override the door and enter). In addition, mechanical locks can be picked or opened without a key. Mechanical locks can also be easily plugged or dismantled simply by filling the keyhole in which the mechanical key is inserted. Mechanical keys are difficult to align in the dark or with one hand (i.e., when one is carrying packages), because they have to be oriented in one specific position and lined up to a very small hole and be rotated to unlock the locking mechanism. In fact, mechanical keys generally require two types of rotation. The first rotation of the key deactivates the lock and the second rotation of the knob unlatches the door. Rotating the key deactivates the locking mechanism, which permits rotating of the knob (i.e., the door remains closed or opened, but is free to be moved back and forth), whereas latching opens or shuts the door. Mechanical keys also often require the additional movements of reversing the rotation to extract the key (i.e., if you rotate it to perform the locking or unlocking function, you have to reverse that same operation just to extract the key once that is accomplished). Mechanical locks cannot identify who used the lock and at what time, much less keep a record of their use.

Regarding electrical locks, electrical locks are not easily accessed and often require alternate forms of accessing methods. For instance, video systems, voice systems, coded systems do not have keys that can be shared and exchanged or managed in a controlled fashion. In addition, these more traditional systems often produce bottlenecks of information.

SUMMARY OF THE INVENTIONS

The present invention provides electrical/mechanical access control systems and methods. In particular, the present invention should be broken down into at least three broad classes of inventions that are each innovative in their own right, but when combined form an innovative electrical/mechanical access control system. These broad sub-classes include a improved door knob assembly, access control system, and a master rekeying device.

Regarding the overall access control system, the overall access control system provides an efficient and flexible system that comprises a centrally controlled system, stand-alone door locks, Master Key Device and the entry keys. More specifically, the access control system comprises a host computer (e.g., a personal manufactured by IBM, Compaq, Apple, etc.), a personal computer adaptor, a inter-linking communication cable (e.g., microLAN), door-controllers, door-readers, and Touch Memory™ keys.

Regarding the improved door knob assembly, the improved door knob assembly provides for an efficient, effective, and reliable electrical locking system that can alternatively be combined with the peaceful coexistence of an electrical locking system and a mechanical locking system. In particular, the door knob assembly comprises a method of coupling an electrical signal from a key through a traditional, mechanical lock core to single-chip or multi-chip electronic circuitry that actuates an electrical motor or solenoid mechanism to unlatch a door, which provides for the peaceful coexistence of mechanical and electrical locking and unlocking systems. Electronic circuitry may exist in a single-chip or multiple chip embodiments and is generally powered by a battery power supply or traditional power supplies to a house, office, etc. Numerous alternate preferred embodiments provide for a removable battery pack and probe contact on the outside of the lock. Similarly, a number of preferred coupling devices exist to transfer the signal from a key device through the lock exist. The signaling technology accompanying the Touch Memory™ technology permits the data exchanged to be virtually error free and requires the contact by the key device to be only a brief momentary contact. Alternate preferred embodiments of the preferred doorknob assembly comprise a method of coupling an electrical signal from a key through a traditional, mechanical lock core to single-chip or multi-chip electronic circuitry that actuates an electrical motor or solenoid mechanism to unlatch a door as well as a gripping apparatus that interlocks with the key to provide a mechanism in which energy can be transferred from a human being using the key to the withdraw a latch, after it has been unlocked, in order to open the lock to open a door. In addition, preferred embodiments may also use a number of modified locking cylinders that may also comprise a battery or battery pack are that in addition to the electronic circuitry needed to actuate the latching mechanism. These cylinders can be easily retrofited into existing locking mechanisms and may be removable from the outside of the lock.

Regarding the master rekeying device, Touch Memory™ technology allows keys and locks to be easily rekeyed electrically without the need to remove mechanical or electrical parts.

The disclosed system and sub-systems have the following advantages. The disclosed invention provides a tremendous number of combinations that cannot be easily and repeatedly duplicated. Since the locking mechanism is on the inside of the door, the disclosed invention is not exposed to the outside and, thus, it is much harder to break the lock and enter the room. The electrical locking system of the disclosed invention is much more difficult to pick or open without a key. Filling the keyhole does not dismantle the disclosed embodiments. Alignment of electrical keys with door locks in the disclosed invention is substantially easier. Therefore, unlocking and opening doors with electrical keys is substantially easier as well. The disclosed invention identifies who used the lock and at what time and keeps a record of their use. The disclosed invention allows users to replace the battery pack without actually unlocking the lock and entering the room, which prevents people from being locked out when the batteries die. Some preferred embodiments of the disclosed invention permit mechanical/electrical locking systems to peacefully coexist and backup one another. For instance, if mechanical locks froze or are more difficult to open in harsh, cold, or inclement weather, the electrical lock could still unlock the door. The disclosed invention provides an efficient access control system that not only grants and denies access, but also logs this information for a main system supervisor or manager. The disclosed invention provides enhanced security, given the ease of rekeying electrical locks/keys in that this can be accomplished without major rework to the door knob itself. The key and actual lock itself are a smooth, planar surface or a shallow cup respectively that cannot be clogged or jammed easily. In short, there are no holes to clog, so the lock prevents vandalism of this nature. If any foreign matter collects in the probe, it can be cleaned by simply wiping it with a finger. There are numerous additional advantages associated with using Touch Memory™ products, which are outline in more detail in the numerous patents and patent applications incorporated by reference hereinabove.

As a result, preferred embodiments address the age old problem of securing an entrance to a closed area without imposing an inconvenience to the user or security manager. As discussed above, mechanical locks are operated with metal (e.g., brass) keys which are cut to match a specific lock. Each person that requires access to the lock is given a key, and fundamentally these keys are easy to duplicate. Therefore, it is difficult to control the duplication of these key and who might get possession of them. Maintaining security then requires everyone to be reissued new keys. Preferred embodiments of the electrical key using Touch Memory™ technology provides higher security because each key contains a unique and unalterable registration number that is read electronically by the lock. In addition, conversely, the preferred embodiments are capable of conforming to the programming of a valid key list. If a key is lost, that registration number is erased from the list of valid users within the lock. Security is maintained and only the one key needs to be reissued.

In addition, preferred embodiments are very easy to use, because preferred embodiments combine the human sense of touch with the simplicity of a quick "Touch of the key" to the locks key way. These new ergonomics are intuitive to the user and retain the familiar look and feel of operating a door lock. Additionally, the brief contact between the key and lock provides a faster opening. Key management is also more convenient for the security manager. Rekeying or reprogramming is done in seconds without the addition or removal of parts through the same key way.

Finally, preferred embodiments of the electrical key and lock cores are very small in size. It is designed to retrofit into most Interchangeable Core lock sets, which resecure a locked area independent of the distribution of keys and are found in commercial settings where key control is imperative. These same perferred embodiments can also take the form of a replacement handle (lever or knob). Where the same design desricbed herein can be repackaged in a larger volume (the entire lock hanle instead of the confineing it to the space occupied by the core. These advantages and additional advantages will be discussed in the Detailed Description and become apparent after reviewing the various embodiments of the invention.

BRIEF DESCRIPTION OF THE DRAWINGS

Further features and advantages will become apparent from the following and more particular description of the various embodiments of the invention, as illustrated in the accompanying drawings, wherein:

FIG. 2 is a preferred access control sub-system 1000 of a preferred overall configuration of an access control system 100 shown in FIG. 1;

FIG. 3 is a preferred block diagram of door controller 112A, 112B, 112C, etc. of the preferred overall access control system configuration 100 in FIGS. 1 and 2 and a preferred circuit diagram of door reader 118A, 118B, 118C, etc., PC Interface Circuity/PC Adaptor 106, Door Control Circuitry 112, Door Reader Circuitry 118A, 118B, etc. (in FIGS. 1 and 2);

FIG. 4A is the preferred circuit diagram of door reader 118A, 118B, etc., P.C, Interface Circuitry/PC Adaptor 106, Door Control Circuitry 112A, 112B, 112C, Door Reader Circuitry 118A, 118B, 118C, etc. (in FIGS. 1, 2, and 3);

FIG. 17 is a cross-sectional diagram of Touch Memory™ lock 122A that illustrates how battery pack 4 is inserted and interacts with the rest of the lock;

FIG. 18A is an exploded view of power pack 4 (as shown in FIG. 17);

FIG. 18B is an exploded view of the power pack.

FIG. 18C is an exploded view of the power pack.

FIG. 22 is a series of cross-sectional diagrams of the Master Keying Device shown in FIG. 1 and FIG. 5;

FIG. 27 shows a traditional lock core 2704 for a traditional dead bolt lock 2704 used with a mechanical keys 2702;

FIG. 28 shows the all electrical lock core 2504 and battery pack 2504A preferably attached and positioned adjacent to locking cylinder 2504B, both of the type shown in FIG. 25;

FIG. 29A shows an alternate perspective view of all electrical lock core 2504 and battery pack 2504A preferably attached and positioned adjacent to locking cylinder 2504B, both of the type shown in FIG. 25;

FIG. 29B shows an alternate perspective view of the electrical lock core and battery pack.

FIG. 29C shows an alternate view of the electrical lock core and battery pack.

FIG. 35 shows an operational state diagram for using an electrical entry key for an alternate preferred embodiment;

DETAILED DESCRIPTION OF THE PREFERRED EMBODIMENTS

General System Overview and Architecture

Figure 1:
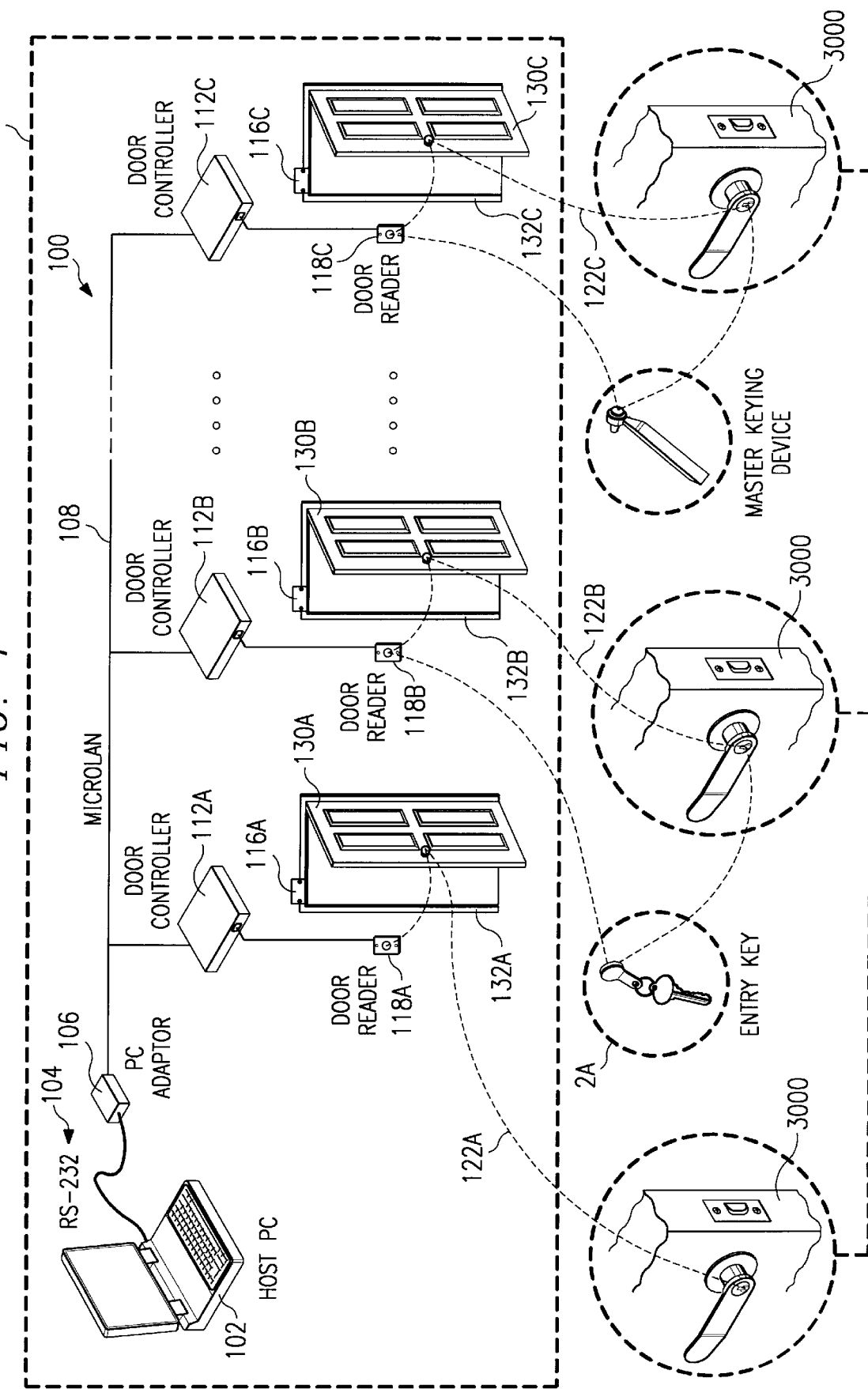
FIG. 1 is a preferred overall configuration of an access control system 100 combined with master keying device 101 and improved door knobs 3000.

FIG. 1 is a preferred overall configuration of an access control system 100 combined with an improved electronic door lock 3000, a master keying device 101 and Touch Memory™ entry keys 2A. This system differs from conventional systems by using a combination of a centrally controlled access system like a traditional wired in access control system and the use of a distributed access control system. In this preferred embodiment, the wired system is shown in the preferred embodiment 1000 and then distributed control is provided by the portions of the electronic door knobs 3000 and they are interconnected together with the use of a master keying device 101. Entry keys 2A operate both the access controls, centrally access control system 1000 and the electronic door knob system 3000. This system is comprised of those four components: centrally controlled system 1000, the stand-alone door locks 3000, the master keying device 101 and the entry keys. The preferred embodiment of the access control system 1000 has the following characteristics. It can provide a real time accountability to the central host PC. In particular, regarding both FIGS. 1 and 2, the preferred overall access control system 100 comprises a host system 102 (e.g., a personal computer manufactured by IBM, Compaq, Apple, etc.) coupled to PC Adaptor 106 via an RS-232 bus 104 to a MicroLAN™ cable 108A, which is a product manufactured by Dallas Semiconductor Corporation, the data sheet of which is incorporated by reference. First MicroLAN™ cable 108A is coupled to a first Single Door Controller 112A, which is powered via connection 114 and coupled to a second MicroLAN™ cable 108B, which is, in turn, coupled to a second Single Door Controller 112B. First Single Door Controller 112A is electrically coupled to first Reed Switch 116A and first Touch™ Reader 118A and first Electric Strike 120A. Second Single Door Controller 112B is electrically coupled to first Reed Switch 116B and first Touch™ Reader 118B and first Electric Strike 120B. Additional Single Door Controllers 112C can be added on to this chain to control additional accesses into additional secure areas 132C, as needed.

Please note that all of the preferred systems discussed herein use electromechanical locking apparatus commonly found in the industry and known to those skilled in the art, such as those commonly manufactured by Best Lock Corporation, Medeco Security Lock, Alarm Lock Systems, Abloy Security, Yale Security, Schlage Lock Company, Interlock, Osi Security Devices, etc. For instance, the Schlage Lock Company manufactures a Series D Electrified lock that uses and provides a solenoid mechanism to electrically actuate the locking mechanism to remove or enable to withdrawal of the latch, so that a door or other barrier to entry can be opened or accessed. In particular, a cam apparatus when rotated releases or withdraws the latch that allows the door to be opened. The mechanical locking systems preferably use tumblers to permit the cam to be rotated. For example, the latch can be removed through the use of a "charged" solenoid surrounding a metal rod attached to the latch, so that when the solenoid is "charged" the rod moves and subsequently removes the latch, so that the door can be opened. Similarly, an electrical motor powered by a power supply (e.g., a battery, standard power supply, etc.) can be used to withdraw the latch as well—when signaled by the access control system shown in FIG. 1 or by the individual keys 2A, 2B, etc. or by a master keying device.

The electronic door locks provide a stand-alone access control system which provides accountability of all accesses and attempted accesses. The data from all said accesses is stored internally in an internal log file. This information can then be uploaded at any time using the master keying device.

Figure 23:
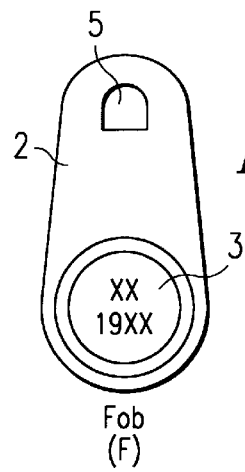
FIG. 23 is an enlarged view of key 2A, which comprises a cell 3.

As discussed above, the disclosed system has a number of advantages. Touch Memory™ locks 122A, 122B, 122C, etc. improve on standard door locks available today with more convenience and security. Touch Memory™ key 2A, etc. (a close up of the outer appearance is shown in FIG. 23) is one of the fastest ways to unlock locks 122A, 122B, so that door 130A and 130B can be unlatched an permit access to secured areas 132A and 132B respectively. The simple pressing motion of the Touch Memory™ key 2A, 2B, etc. to lock 122A and 122B, along with its speed is more convenient at a modest price point. Additionally, the Touch Memory™ lock can provide an audit trail and a means of linking itself into access control system 100. Each Touch Memory™ key 2A and 2B contains a unique registration number that the lock compares to an internal list of valid users for access. Key management is simplified to updating the valid users list. Rekeying can be performed electronically in seconds without the addition or removal of any parts. As described above, the benefits of the Touch Memory™ lock are that it is easy to use; it simplifies key management, it collects an audit trail; it is highly secure; it operates on very little power;, it preserves the appearance of the lock and it can peacefully coexist with mechanical keys 20 (identified as key 2A and 2B in FIG. 1 and shown in more detail in FIG. 7).

Master Keying Device 101 can be used to rekey Touch Memory™ locks 122A and 122B. As explained in more detail below, Master Keying Device 101 is a multi-function tool which can open Touch Memory™ door lock 122A, 122B, 122C, etc., like a typical master key and can also: add a single key, delete a single key, erase the valid user list, set the time, collect the audit trail data, and load a new valid user access list. When the Master Keying Device 101 touches the Touch Memory™ lock 122A, 122B, etc., information is transferred in seconds while using the same electronic key way used by the Touch Memory™ keys 2A, 2B, etc.

As discussed, the Touch Memory™ lock 122A, 122B, 122C, etc. works in both small and large applications. For residential use, preferred embodiments of Touch Memory™ lock 122A, 122B, 122C, etc. preferably operate up to 10 Touch™ entry keys and one master control key 101 for key management purposes, but this can be expanded—as in commercial applications. In commercial applications where a large number of entry keys are required or an audit trail and networking are needed, key management is performed with Master Keying Device (MKD) 101.

Figure 4B:
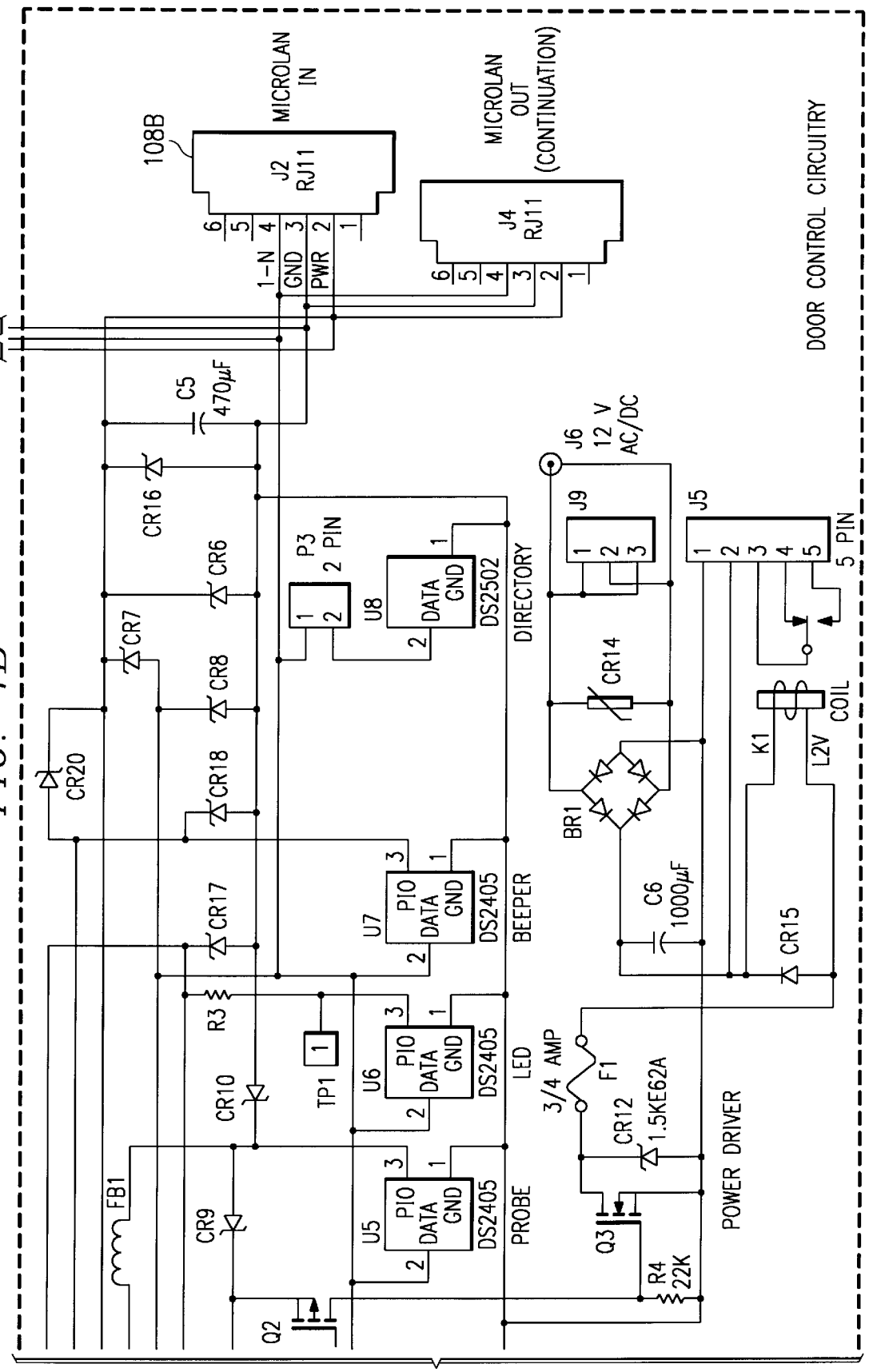
FIG. 4B illustrates how the circuitry shown in FIG. 4A and the overall access control system 100 in FIGS. 1 and 2 can be implemented in a pre-fabricated printed circuit board arrangement.
Figure 4C:
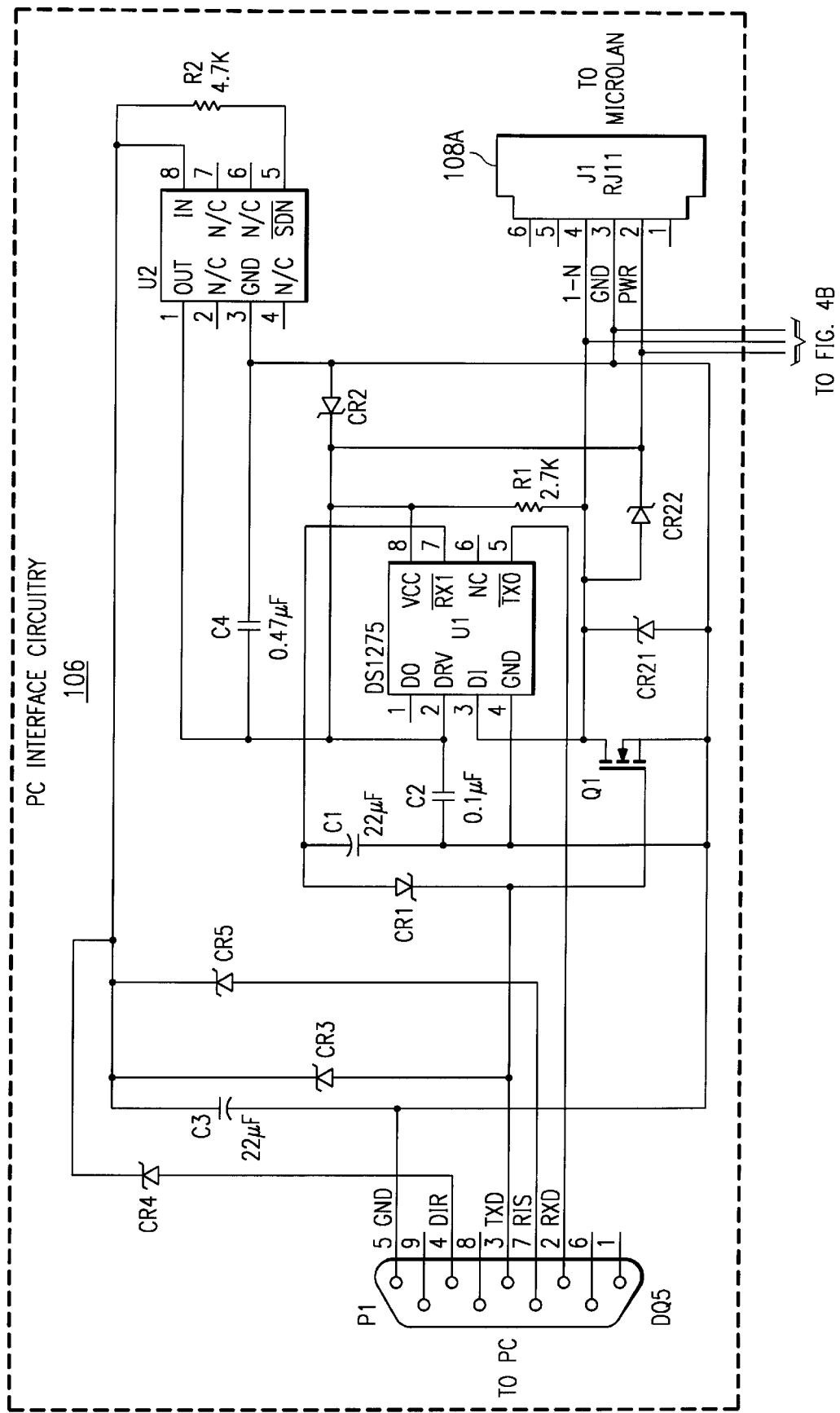
FIG. 4C is a circuit diagram of the PC interface circuitry.
Figure 4D:
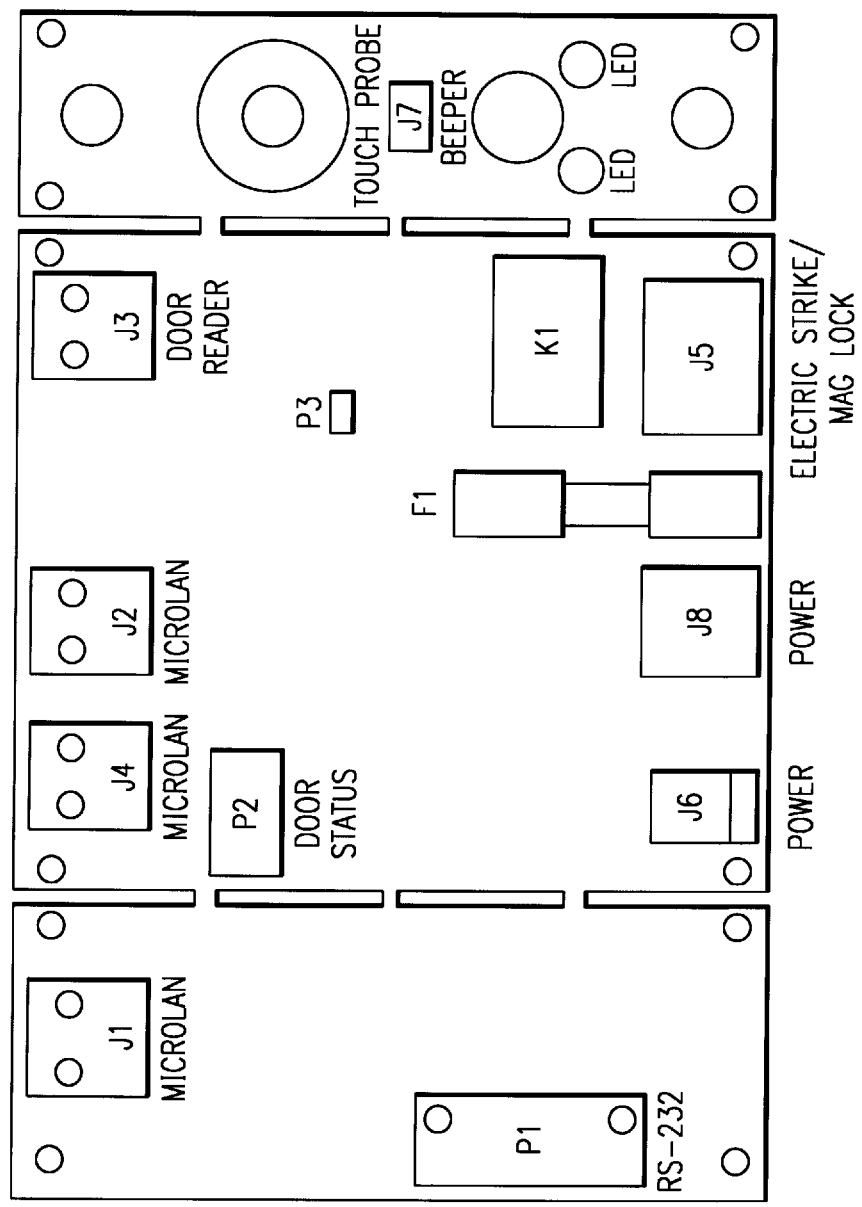
FIG. 4D is a schematic diagram.

FIG. 3 is a preferred block diagram of door controller 112A, 112B, 112C, etc. of the preferred overall access control system configuration 100 in FIGS. 1 and 2 and a preferred circuit diagram of door reader 118A, 118B, 118C, etc., PC Interface Circuity/PC Adaptor 106, Door Control Circuitry 112, Door Reader Circuitry 118A, 118B, etc. (in FIGS. 1 and 2). FIG. 4A is a preferred circuit diagram of door reader 118A, 118B, etc., P.C, Interface Circuitry/PC Adaptor 106, Door Control Circuitry 112A, 112B, 112C, Door Reader Circuitry 118A, 118B, 118C, etc. (in FIGS. 1, 2, and 3). FIG. 4B illustrates how the circuitry shown in FIG. 4A and the overall access control system 100 in FIGS. 1 and 2 can be implemented in a pre-fabricated printed circuit board arrangement. The table shown in Appendix A shows all of the corresponding hook-up connections, etc.

Regarding PC Adaptor 106, PC Adaptor 106 transforms the RS-232 signals from the PC into a 1-wire communication network called MicroLAN™, which is manufactured by Dallas Semiconductor Corporation, and supplies a small amount of power for the circuits on the Door Controller 112A, 112B, etc. and Door Reader circuit boards 118A and 118B (Touch™ Reader 118A and 118B). MicroLAN™ is created using the UART in the PC and IC U1 on the demo circuit board. U1 translates the voltage levels from +/-12 volts (per the RS-232 standard) to +5 VDC and a ground reference. The UART in the PC creates the timing required for communicating with Touch Memory and other 1-Wire devices. The communication standard is specified in detail in the "The DS19xx Book of Touch Memory Standards", which is herein incorporated by reference. This demo uses the TMEX software drivers (DS0620) to manipulate the UART so as to meet the communications standard. The MicroLAN™ not only provides a communication medium but can all so provide small amounts of Vcc power to other circuits on-line given a very limited load. When power is acquired this way it is referred to as Parasite Power. Special care must be taken when using parasite power, so as to not pull the entire MicroLAN™ to ground. The parasite power in this demo is derived locally, meaning at the I/O circuits using them. When the signal "PWR" is absent, the energy from parasite power is stored in C5. When using parasite power, this local supply is sufficient for brief flashes of the LEDs and brief sounds from the beeper as well as gate drive for Q3 and a pull-up potential for U3-PIO. If the "PWR" signal from the PC Interface (or some other 5 VDC source) is used then far less consideration for the duration of the acknowledge signals need be given. Parasite power is mentioned as a design aide to the user. The use of PWR is preferred in all designs if possible. It should be noted that this demo kit uses the +5 volt power "PWR" derived from the voltage regulator U2. This power supply is capable of sourcing 15 mA at 5VDC. As mentioned the "PWR" power which is connected alongside the MicroLAN™ signals (1-W and GND) is optional. A pinout the RJ11 MicroLAN™ connector is seen in the following figure.

In particular, the relay drive MOSFET comes from Q3. It should get sufficient gate-drive voltage to activate K1 regardless of which power method is employed. The contacts of the relay are provided at J5 for driving the load (solenoid, striker, etc.). If the "PWR" signal is not provided and the relay is removed so Q3 can directly drive an external device, then a low-gate-threshold transistor such as the Supertex TN0610N5 (or equivalent) is recommended. The Power Circuits are readily adaptable to 24 Volt operation if Relay K1 (presently 12B coil) is replaced with a relay having a 24V coil.

Door Controller 112A and 112B has circuits that have an I/O that is controlled by all DS2405 Addressable Switches (U3 through U7). In some cases the output of these IC's are buffered or voltage level shifted. The output controlling the electric strike comes indirectly from U4. Its output is level shifted by Q2 and Q3 which in turn drive the relay which controls the electrical strike. When first plugged in and turned on, the output or PIO of U4 will be high, because of the pull-up by R5. When commanded, the PIO of U4 goes low energizing the relay.

Operation of all the outputs is similar to that of U4. U3 which is an input is read directly by the PC. Its input requires only a switch closure. The demo is set up for normally open contacts. This assumes when the door is closed the contacts are closed, due to the magnet. When the door is opened, the contacts open, and U3 will read a HIGH, or door open.

Regarding the Door Reader 118A, 118B, etc., the minimalist design of the MicroLAN™ provides for no components out at the door reader 118A, 118B, etc. This enables the installer to place a Touch™ reader in a door mullion and other small location which previously could hold any type of reader, like Weigand or magnetic stripe.

Please note that Door Reader 118A, 118B, etc. preferably contains no electrical components and can, therefore, fit in a very small space. Similarly, DS2502 contains a directory of particular Serial Numbers of DS2405's and correlates them to their respective functions. Additions and subtractions of Single Door Controllers 112A and 112B are "plug-and-play", because the host looks to the directory in the DS2502 of available hardware on the MicroLAN™.

Please note that all electronics in door controller 112A, 112B, etc. (and Touch™ door reader 118A and 118B) preferably use parasite power with the exception of external power source 114A, 114B, etc., which drives the relay for the electric lock. In addition, please note that the MicroLAN™ goes through Single Controller Board 112A and 112B and has no immediate direction.

More specifically, referring to FIGS. 1 and 2 again, external power 114 is required only to operate the on-board relay K1 and drive electric strike 120A, 120B, 10C, or magnetic locks (not shown). This can be either AC or DC power, but preferred system embodiments in the present configuration will only operate up to 12 volts maximum.

Regarding Host Personal Computer ("PC") 102, preferred system embodiments utilize a DOS Windows based pc. Host PC 102 preferably has 640K RAM, 5¼ floppy drive and a RS-232 port capable of running at 115.2K baud. If the RS-232 port has a 25 DB connector, consideration must be taken to mate with the 9-pin female DB connector on board (shown below).

The software continuously monitors the MicroLAN™ to determine if there are any users at the doors. This is accomplished by searching for 1-Wire devices other than the DS2502 (EPROM) and DS2405 (Addressable Switch). This is a fairly straightforward task since each device has a unique family code. The DS2405 devices that enable Touch-Probes™ are left normally on. When a key is detected on the MicroLAN™ all of the TouchProbes™ are disabled. Each TouchProbe is then enabled and a check is made for a key. If no key is detected then the TouchProbe is disabled again and the next one is checked. This process is repeated until the key has been located or there are no more Touch-Probes™ to be checked (insufficient dwell time). If the key has been successfully located then the software knows which DS2405 devices will be used to acknowledge (blink and beep) and which DS2405 device should be turned on to unlock the door. This "binding" information comes from the function map file (FMAP.000) which was placed in the DS2405 devices when the board was manufactured. The registration numbers of the DS2405 devices are stored in an ordered list in the function map file. The order of devices is:

1) Probe Enable
2) LED Control
3) Solenoid Control
4) Door Status
5) Beeper Control In addition to looking for keys at the TouchProbes™, the software also performs another important task. The access control network is configured when the program is first executed and following the "N" reconfiguration command. When the configuration process is complete a table of all permanent devices in the network resides in memory. Even when there are no users of the network at the doors the program continues to survey the MicroLAN™ and verify the proper states of DS2405 devices. This results in a very important security feature. If a door controller is removed or damaged it will be promptly detected and reported to the system console (PC screen). A record of the events will also be placed in the log file. Thus the program protects the network against tampering.

For additional features and implementation details please refer to the attached program source code listing.

The TMEX™ resident functions should first be installed by entering the following command lines at the DOS prompt:

BASFUN

EXTFUN

TMEXFUN

When the program "Door.Exe" is executed from the DOS command line it will search for the TMEX™ resident functions above. If these are found, it will then check for a com port number on the command line. If no port is specified on the command line then port 1 will be used. The program will then attempt to setup the requested port for 1-Wire communication. If the setup is successful the default disk directory will be searched for the list of authorized keys. The key list is contained in two files, "Users.Txt" and "Users.Bin". "Users.Txt" is an ASCII text file and may be modified by using a text editor. "Users.Bin" is a binary file of the TouchMemory registration numbers which are authorized to open the door.

Initially there will be no "User" files and the program will display the message "No list of authorized keys!". A user list can be created in the program by using the insert key command ("I"). Other functions for maintaining the list will be discussed later.

The program will then search the MicroLAN™ for DS2505 devices. Each time a DS2502 is discovered the program will attempt to read a file named "FMAP.000". This file associates DS2405 registration numbers with specific control and monitoring functions performed by the respective DS2405 devices. Each time a new DS2502 with the function map file is discovered, the program automatically adds a new access point (door) to the present configuration.

After the above initialization steps, the program will proceed with the main task of looking for users at the door(s)

and/or keystrokes from the PC. When authorized keys are recognized on the TouchProbe(s) a brief flash and beep will acknowledge that the key has been read. The key can now be removed from the probe. The door unlock signal is issued and the relay coil will be energized (if the power has been connected). The program creates/maintains a file on disk named "DoorLog.Txt". This file contains a journal of significant events in the operation of the door(s). If the file does not already exist in the current default direction it will be created. When the file already exists new event descriptions will be appended to the end of it. It is intended that this information be collected from time to time and the old file be deleted to conserve disk space. Each time the file is deleted a new one will be started the next time the program is invoked. Some of the events recorded in the log are:

Door opened for authorized key.

Presence of authorized key.

Monetary disruptions of MicroLAN™ operation can be caused by shorts on the TouchProbes or disconnections of the cables. Some of these disruptions are to be expected based on probe contact technique. Extensive and prolonged error messages indicate a network fault condition. Check cables etc.

The following is the help menu displayed by the program when the "?" key is pressed:

| Esc to Quit | ? for this menu |
|---|---|
| I to Insert a key into the list | D to Delete a key from the list |
| C to Clear all keys in list | L to List keys |
| W to Write key list to disk | R to Read key list from disk |
| N for Network configuration | K for Key maintenance |
| V to View log file | F to Freshen MKD key list |

A brief description of the functions available follows:

"Esc" is used to quit the program. When the escape key is pressed the program will confirm the user's intention to exit the program, since the door(s) do not function when the program is not running.

"L" is used to list the authorized keys in the active program memory. This list is not the same as the list on the disk except after the "W" or "R" commands discussed below.

"I" is used to insert a key into the list. The program will first ask for the name associated with the key. After the name has been entered on the keyboard, the program will request that the key be placed on a TouchProbe. After the key has been detected it will be entered into the memory-resident key list. The key will then be authorized to open the door and will be displayed when the "L" command above is executed. The newly inserted key will not have a permanent entry in the disk based key list unless the "W" command below is used. If the "W" command is not executed the key will only be authorized until execution of the program is terminated.

"D" is used to delete a key from the memory-resident key list. After the delete command is entered the program will prompt for the key to be deleted to be placed on a TouchProbe. After the key is detected on the probe it will be deleted from the list. A key can also be deleted by entering the number which corresponds to the key's position in the list displayed. To make changes permanent, use the "W" command described below.

"C" is used to clear the entire list of authorized keys. As with the commands described above, only the memory-resident list is affected. Use the "W" command below to transfer the now empty key list to disk. Until the "W" command has been executed the last list of keys stored on the disk can be restored with the "R" command described below.

"?" will cause the help information to be displayed.

"W" is used to write the memory-resident key list to disk. This makes changes to the key table from the commands above permanent. The new key list placed on disk will automatically be read the next time the program is invoked. The "User" files are written to the current default directory on disk.

"R" is used to read the key list from disk into memory. The key list stored on the disk will immediately over-write the memory-resident list. This permits temporary changes made to the key list to be cancelled.

"N" is used to reconfigure the access control network. The software will search again for DS2502 devices with function map files. Any new door controllers found will be included in the system configuration.

Any door controllers which have been disconnected will be removed from the system configuration table.

"K" is used for special function key maintenance. The "MASTER", "ADD", "DELETE", and "ERASE" function keys used for the stand-alone lock are created using this command. When the text entered for this function is "MKD" a special routine is invoked which configures a new Master Keying Device (MKD).

"V" is used to View the log file "DoorLog.Txt". A single page is displayed each time a keystroke is entered until the entire log file has been viewed.

"F" is used to "Freshen" a Master Keying Device. Freshening consists of re-writing the list of authorized keys in the MKD and resetting the time in the MKD's DS1994 from the PC clock. This command is only used on an MKD which has already been configured using the "K" command above.

Significant portions of the actual software code used to implement the functions described above is shown in Appendix A.

Figure 5:
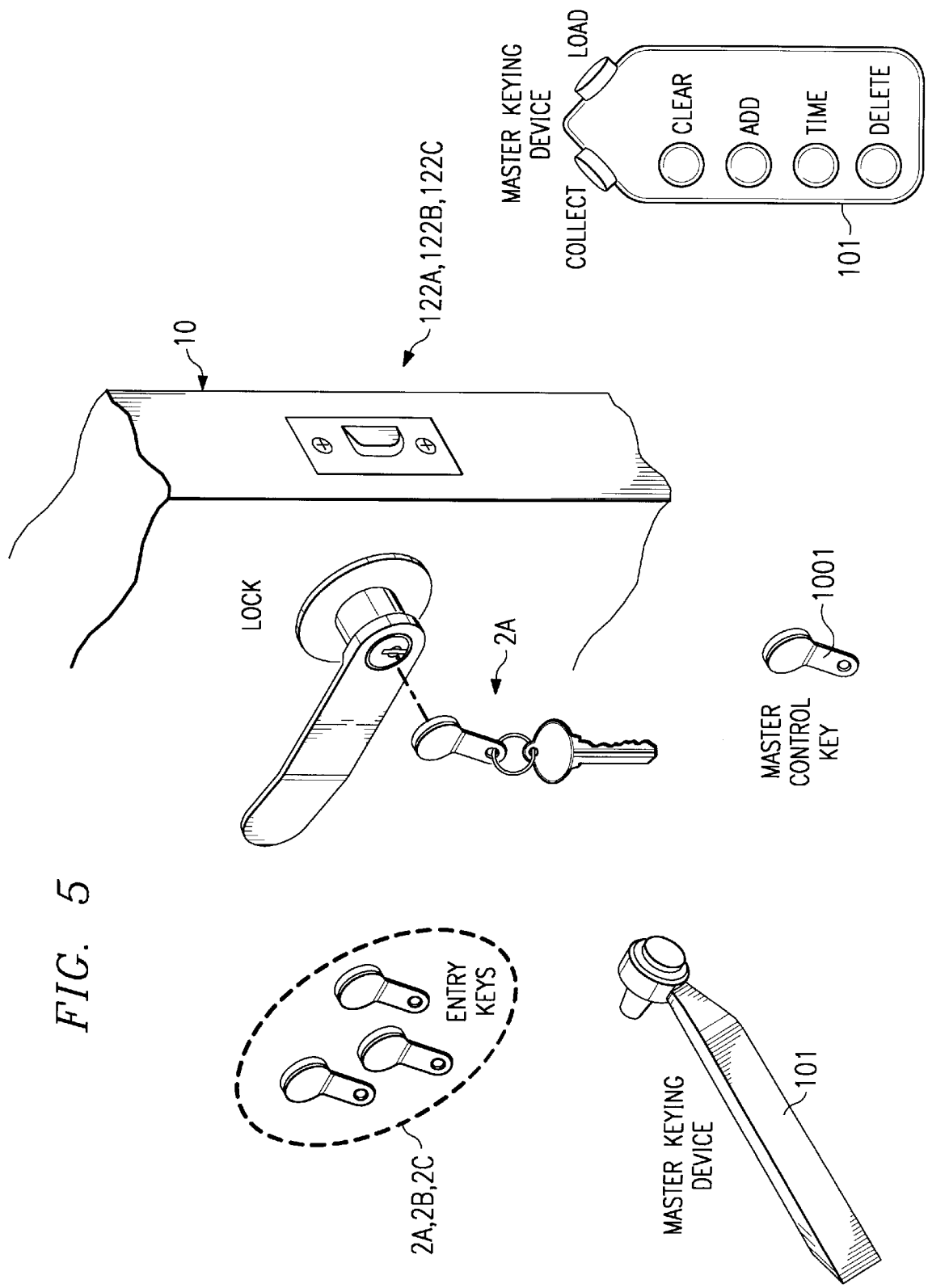
FIG. 5 is a close-up illustration of Touch Memory™ locking systems 3000 as well as alternate embodiments of Master Keying Device 101 and Master Control Key 1001 and Touch Memory™ keys 2A, 2B, 2C, etc.

FIG. 5 is a close-up illustration of Touch Memory™ locking systems 3000 as well as alternate embodiments of Master Keying Device 101 and Master Control Key 1001 and Touch Memory™ keys 2A, 2B, 2C, etc. The system shown in FIG. 5 has several key management advantages. In particular, preferred access control system 100 and Touch Memory™ locks 122A, 122B, 122C, etc. (as shown in FIGS. 1, 2, and 5 have three types of keys work with the Touch Memory™ lock 122A, 122B, 122C, etc.: entry keys 2A, 2B, 2C, etc., master control keys 1001, and Master Keying Device 101 (two alternate physical configurations are shown in FIG. 5). Entry keys 2A, 2B, etc., as the name implies, are for general use to unlock or lock. Master control key 1001, typically only one per system, is for manually managing the list of valid keys which are kept in the lock's non-volatile memory. Master Keying Device 101 performs all the functions of the master control key 1001, plus it can download audit trail data, upload the entire valid user list in the event the list is too long to edit manually with a master control key 101, and calibrate the timekeeper in the lock electronics. All types of Touch Memory™ products, which are manufactured by Dallas Semiconductor Corporation can operate as entry keys. Although, the DS1991, which is manufactured by Dallas Semiconductor Corporation, has special significance to the lock as a potential master control key. When the lock sees a DS1991 Touch MultiKey, it will initially interpret it as a master control key for lock management functions. If the key does not respond with the appropriate secure data, the lock then looks to the registration number for access.

This system provides four standard key management functions and three special functions of overall access system 100. The standard function set includes: open like a typical master key, add a single key to the valid list, delete a single key from the valid list, and erase all entries from the valid key list. The special function set is; update the timekeeper, collect the audit trail, and load the valid entry list. The standard key management functions described above are intended for use in small applications, such as residential or consumer settings.

For commercial applications, there are a greater number of active entry keys and an audit trail may be required. The special functions are only accessible using an Master Key Device 101 and a host PC 102. Regarding the residential key management applications and advantages described above, rekeying Touch Memory™ lock 122A, 122B, etc., for residential application only requires a master control key. With single key 2A, 2B, etc., the four standard key management functions can be performed. Each function is related to how long the master control key is held in contact with the Touch Memory™ lock 122A, 122B, etc. For instance, a single touch of master control key 101 (for a duration less than one second) will open the Touch Memory™ lock 122A, 122B, etc. like a typical master key. (It is assumed that the Touch Memory™ lock 122A, 122B, etc. has some form of user feedback either audio or visual. The mode status of the Touch Memory™ lock 122A, 122B, etc. will always be shown by this method of feedback). If key is held in contact with the Touch Memory™ lock 122A, 122B, etc. for between one and two seconds, the Touch Memory™ lock 122A, 122B, etc. will expect the next key it see to be added to the valid entry list. After the new entry key is touched to the Touch Memory™ lock 122A, 122B, etc., the Touch Memory™ lock 122A, 122B, etc. will return to normal entry operation. If another key is to be added to the list this same process must be repeated. When the master control key 101 is held in contact with the Touch Memory™ lock 122A, 122B, etc. for between two and three seconds, the Touch Memory™ lock 122A, 122B, etc. will delete the next key it sees from the valid access list. The key to be deleted from the valid user list is then touched to the Touch Memory™ lock 122A, 122B, etc. This completes the transaction and then the Touch Memory™ lock 122A, 122B, etc. will return to normal entry operation. Again, if another key needs to be deleted the same process is repeated. For lost keys, the entire list must be deleted from the Touch Memory™ lock 122A, 122B, etc. and all the valid keys reentered. To erase the entire list, the master control key is held in contact with the Touch Memory™ lock 122A, 122B, etc. for greater three seconds. The Touch Memory™ lock 122A, 122B, etc. will signal that the list has been erased. Then the only key that will operate as an entry key is the master control key. To create a new master control key the Touch Memory™ lock 122A, 122B, etc. must be placed in the "Imprint Mode". When the Touch Memory™ lock 122A, 122B, etc. contains an empty key list, it is in the Imprint Mode. The first Master Control Key or MKD that the Touch Memory™ lock 122A, 122B, etc. sees, in the Imprint Mode, will become the new master control key. The master control key can then modify the valid access list as required. After the Touch Memory™ lock 122A, 122B, etc. is setup, it is suggested that the master control key be taken out of use and placed in a safe location.

Figure 6:
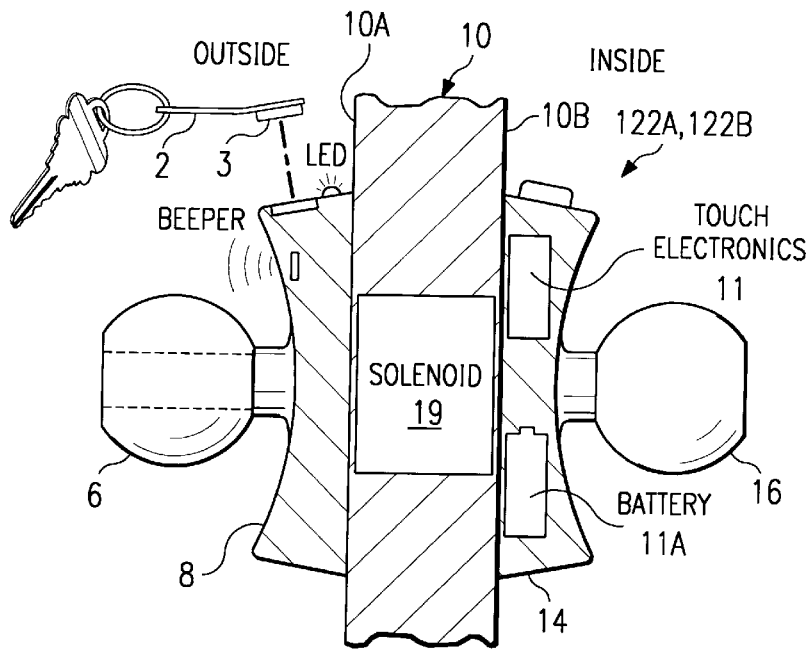
FIG. 6 is a cross-sectional diagram of a preferred door knob assembly or Touch Memory™ lock 122A, 122B, shown in FIG. 1, which that can operate in conjunction with preferred overall access control system configuration system 100 or as a stand alone access control system.
Figure 7:
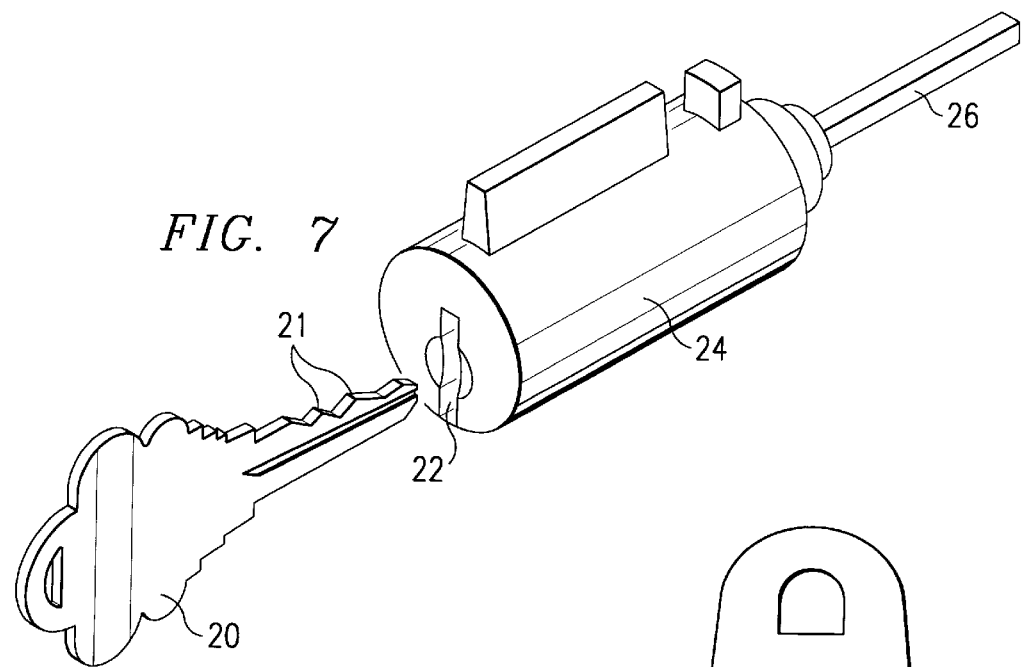
FIG. 7 is a close-up view of a mechanical lock core.

Referring to FIG. 6, which is a preferred embodiment of Touch Memory™ lock 122A, 122B, etc., as well as Master Keying Device 101 and keys 2A, 2B, etc., A major benefit of the Touch Memory™ lock 122A, 122B, etc. is that the Touch™ key was made to fit exactly where the standard lock core resides in the knob. Now the planer surface on the face of the core can be used as the data contact for a Touch™ key reader thus providing a peaceful coexistence between the Touch™ reader and the mechanical lock core, as shown in FIG. 7. The outer edge of the core slot provides a contact for the rim of the Touch™ key completing the electrical circuit. This simple interface therefore preserves architectural appearance of the door while improving the locks functionality and ease of use. 1-Wire™ communication, which is described in several of the patents and patent applications listed above, which are herein incorporated by reference, enables the access control system 100 to work efficiently, (assuming the lock chassis is electrical ground). In particular, a single conductor is significantly easier to route through rotating components than multiple wires. Access Communication is nearly error free when the "Dallas 1-Wire Protocol" is followed. This scheme packetizes the data and uses Cyclical Redundancy Checks (CRC) to validate data, which is described in several of the patents and patent applications described above. A detailed description of the protocol is found in the "DS19xx Touch Memory Standards Book", which is herein incorporated by reference.

FIG. 6 is a cross-sectional diagram of a first preferred embodiment of the door knob assembly 122A, 122B, etc. of FIG. 1, which can also operate in conjunction with the preferred overall access control system configuration system 100 and as a stand alone access control system. The door knob assembly 122A, 122B, etc. uses electrical locking and unlocking mechanisms. Note battery 11A (e.g., 3 volt, lithium battery) is on the inside (side 10B) of door 10, so it is not possible to change the battery from the outside, which is possible in alternate preferred configurations shown in other figures. In addition, note that the embodiment also shows a LED and a beeper to signal whether the lock has been opened or not. In this fashion, the lock has some form of user feedback either audio or visual. The mode status (e.g., green light: open, red light: closed, yellow: working, etc.) of the lock always provides feedback. FIG. 6 also shows solenoid 19, which is used to open door lock 122A, 122B, etc. shown, which, due to the orientation of door 10. Important features the preferred embodiment of door locking system shown in FIG. 6 is the coexistence of the Touch Memory™ electrical locking/unlocking access capability and the more traditional mechanical access capability. However, alternate configurations shown in the following Figures show alternate embodiments of electronics 11 (e.g., multi-chip, single chip embodiments) and an alternate embodiments that transmitting signals through the lock core 6 of knob 17 itself in a variety of fashions.

Figure 8:
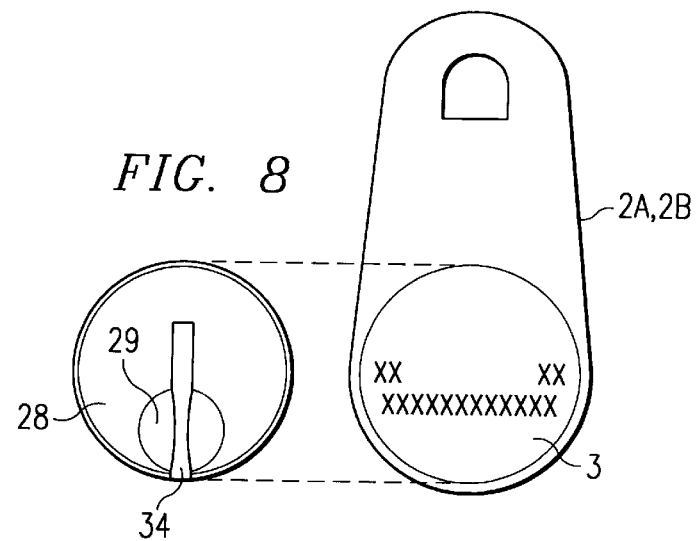
FIG. 8 is an illustration of the lock core face found in Touch Memory™ locks 122A, 122B, 122C, shown in FIGS. 14–15.
Figure 13:
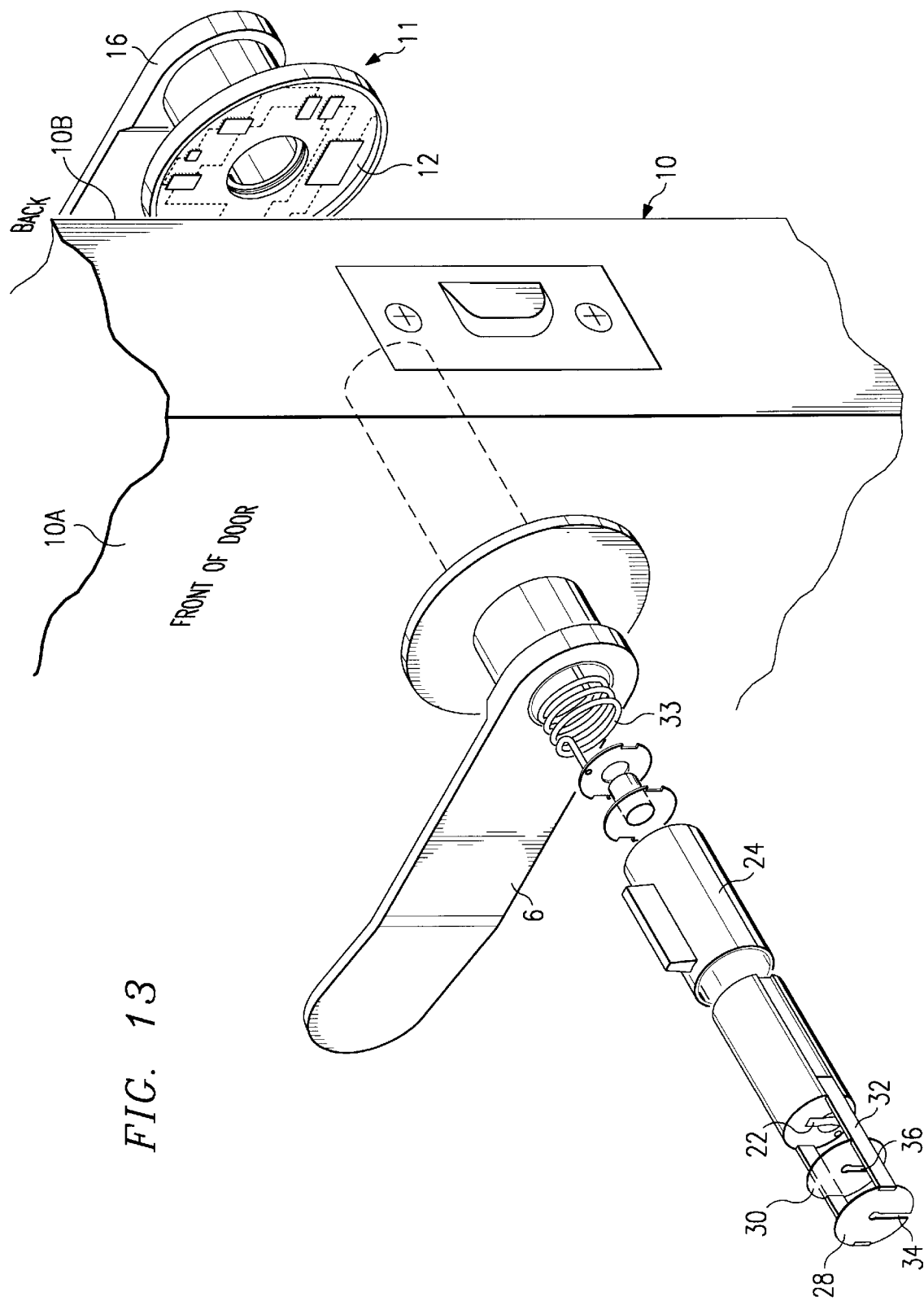
FIG. 13 is an illustration showing an alternate embodiment of Touch Lock™ lock 122A, 122B, 122C, etc. illustrating the alternate embodiment (e.g., insulated metal grooves) of providing an electrical contact from the Touch Memory™ face through the lock core that demonstrates the peaceful coexistence of the overall lock along with the multi-chip electronics 11.
Figure 14:
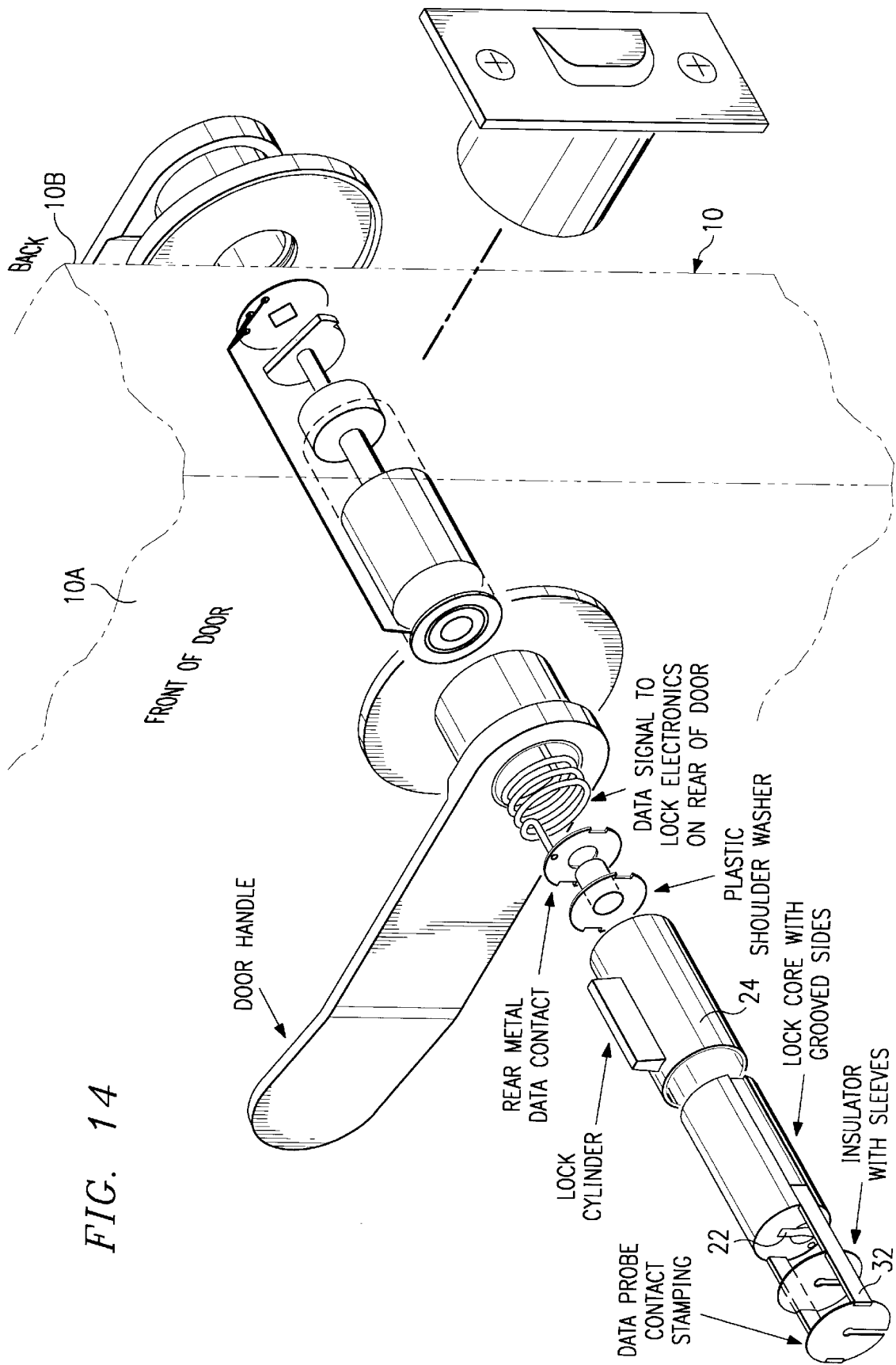
FIG. 14 is an illustration showing an alternate embodiment of Touch Lock™ lock 122A, 122B, 122C, etc. illustrating the alternate embodiment (e.g., insulated metal grooves) of providing an electrical contact from the Touch Memory™ face through the lock core that demonstrates the peaceful coexistence of the overall lock along with single-chip version of electronics 11.
Figure 15:
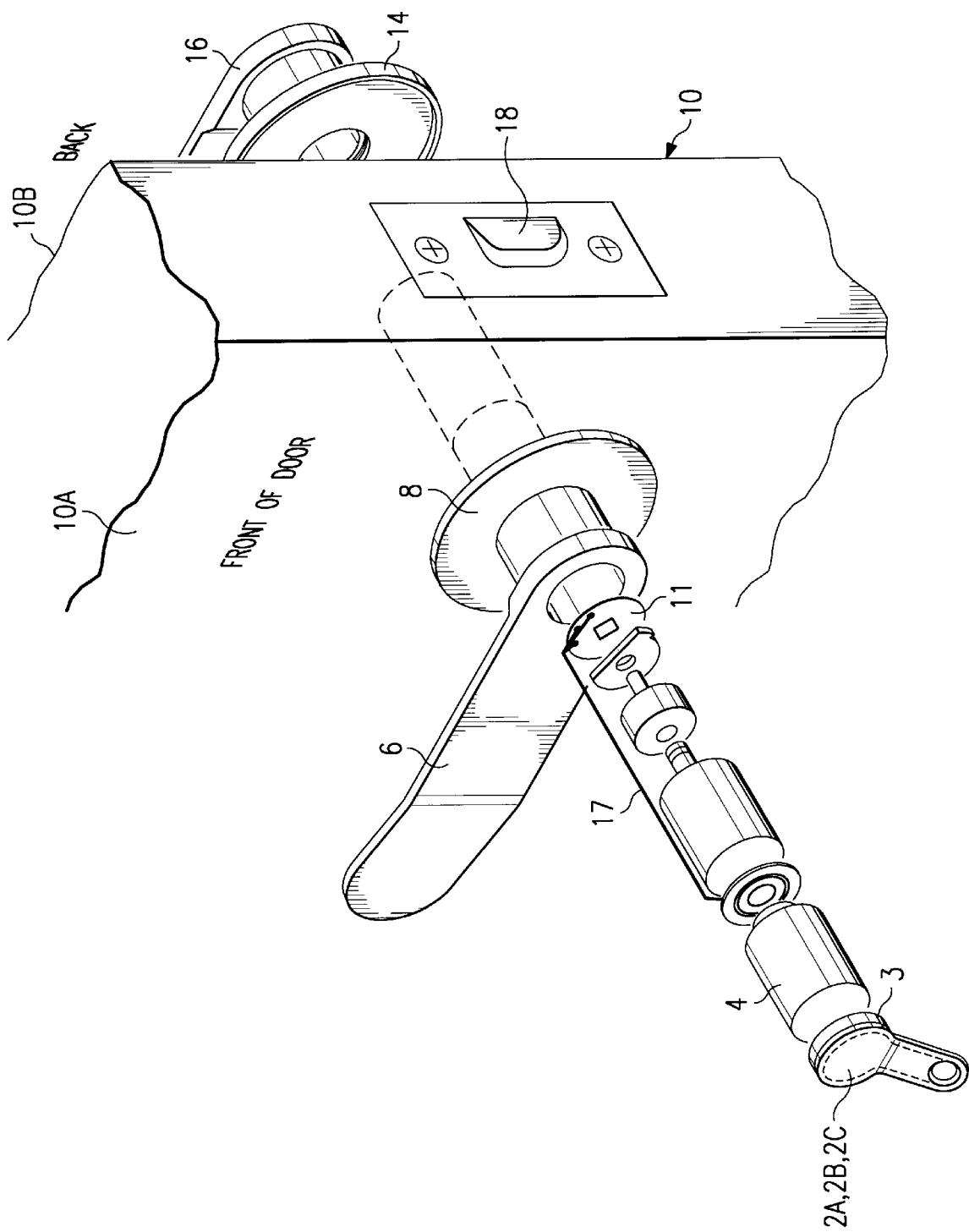
FIG. 15 is an illustration showing an all electric lock of Touch Lock™ lock 122A, 122B, 122C, etc. illustrating an alternate embodiment that provides a removable battery pack and probe contact on the outside of the lock, where the lock core normally resides, which uses a single-chip version of electronic circuitry 11.

FIG. 8 is an illustration of the lock core face found in Touch Memory™ locks 122A, 122B, 122C, which is an important feature shown in FIGS. 14–15. FIGS. 8–14 document in great detail the peaceful coexistence of electrical/mechanical locking systems.

Figure 9:
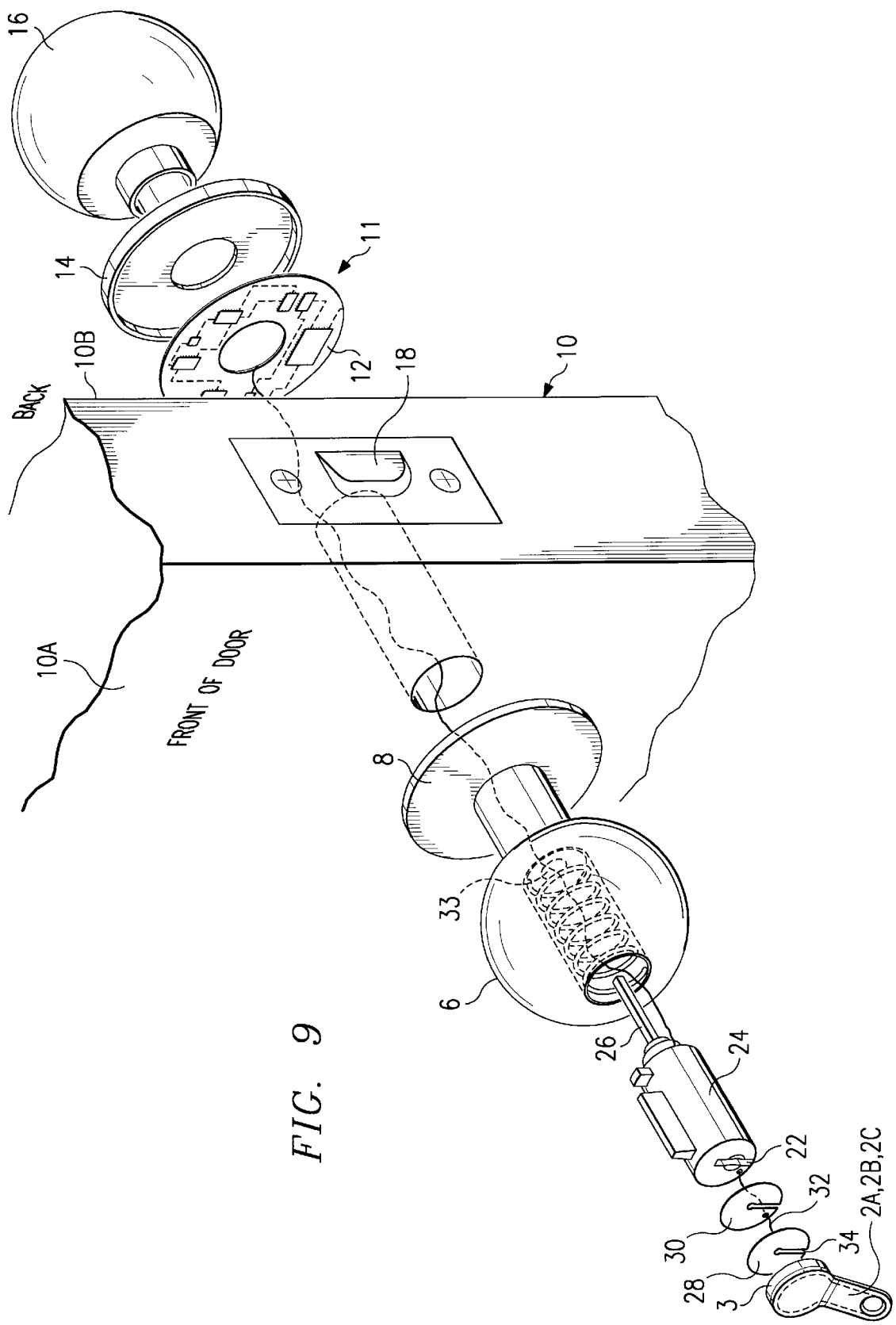
FIG. 9 is an illustration of a cross-sectional diagram of a second alternate preferred embodiment of the door knob assembly or Touch Memory™ lock 122A, 122B, etc. of FIG. 1, which can also operate in conjunction with the preferred overall access control system configuration system 100 and as a stand alone access control system as well as close-up perspectives of various components found in some or all of the alternate embodiments of the door knob assembly 122A, 122B, etc.
Figure 10:
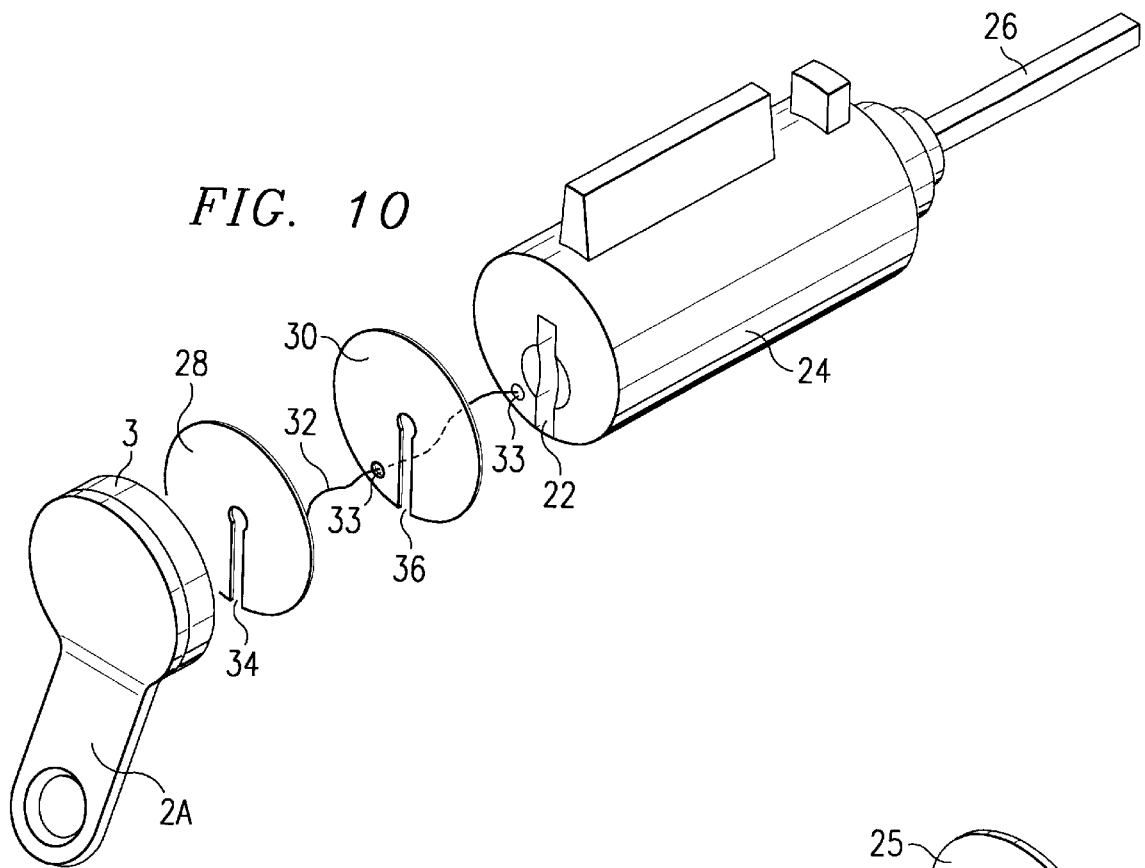
FIG. 10 is an illustration of the lock-core sub-components found in the embodiment shown in FIG. 9.

FIG. 9 is a cross-sectional diagram of a first alternate preferred embodiment of the door knob assembly or Touch Memory™ lock 122A, 122B, of FIG. 1, which can also operate in conjunction with the preferred overall access control system configuration system 100 or as a stand alone access control system. FIG. 10 is an illustration of the lock-core sub-components found in the embodiment shown in FIG. 10, which illustrates how the necessary one-wire can be wired through the lock itself to the Touch Electronics 11. The overall system comprising electrical locking and unlocking mechanisms, which is generally denoted by reference number 122A, 122B, etc., which corresponds with FIG. 1. Although the improved door knob shown in FIG. 9 is a stand-alone access control system, as shown in FIG. 1, it is possible to interconnect or link the electronics in FIG.

9 with additional circuitry or systems (e.g., personal computers, work stations, etc.) that can be used to monitor the access to areas secured by door 10. As shown, improved Door Knob 122A, 122B, etc. is positioned on a traditional door 10 having a first surface 10A (e.g., an outside or front surface) and a second surface 10B (e.g., an inside or back surface) and extends through door 10 from first surface 10A to second surface 10B. First knob 6 is attached to first face plate 8. Both first knob 6 and first face plate 8 are positioned on first surface 10A. Second knob 16 is attached to second protective plate 14. Both knob 16 and second face plate 14 are positioned on second surface 10B. Second face plate 14 covers and protects electrical circuitry 11 found on printed circuit board 12. Like second protective plate 14, printed circuit board 12 is circular in shape and has a hole in the middle to permit access to second knob 8. Key 2 houses cell 3 which electrically couples with power pack 4, which is, in turn, electrically coupled via dotted path 17 with circuitry 11, which is preferably integrated into a single integrated circuit 11 (shown in alternate embodiments) and printed circuit board or presented as a multi-chip circuitry 11 (as shown in FIG. 9). In addition, as shown in FIG. 8, the exterior surface has been modified to allow a mechanical key to be inserted therein. Please also note the stiff-leads that are used for electrical contacts 17. Once again, key features to not in this embodiment are the multi-chip version of electronics 11 and the method the wire is strung through the lock.

The embodiment shown in FIG. 9 demonstrates the peaceful coexistence of a combined mechanical and electrical locking systems, which was referenced above. As shown in FIG. 9, a major benefit of the Touch Memory™ technology is that can fit exactly where the standard lock core resides in the knob. Key 2A, which as described in FIG. 1A, houses cell 3, which functions as the electrical key alternative. Face plate 28, which is preferably planar (but not necessarily), functions as a data contact for an isolated signal for data line 17 (in FIG. 9) from electrical key 2 to electrical unlocking mechanism (not shown), which unlocks the door lock, so that the door can be unlatched. Insulating disk 30 insulates face plate 28 from core 24. Face plate 28 is electrically coupled to core 24 via an insulated wire 32. Insulated wire 32 is soldered to face plate 28 (lower left had quadrant when looking at the face plate) and stretches through an opening 33 in insulating disk 30 and a corresponding opening in core 24 and the entire length of core 24 (through all the mechanisms and slip rings associated with the rotation). Opening 33 is a hole that has been preferably drilled from the front of cylinder or core 24 to the rear of cylinder or core 24 and an insulated wire has been strung through that hole. Core 24 houses mechanical tumblers (not shown), which when aligned with key 20 (see FIG. 23), permit core 24 to be turned. Please note that the remainder of the lock essentially functions as a ground and will act as a second conductor. Core 24 has slot 22 that accepts mechanical key 20. Similarly, face plate 28 and insulating disk 30 have similar slots 34 (in face plate 28) and 36 (in insulating disk 30) to permit mechanical key 20 to be inserted through slots 34 and 36 and into slot 22 into core 24. The outer edge of the core 24 provides a contact for the rim of the Touch Memory™ module 3 on key 2 in order to complete the electrical circuit. This simple interface therefore preserves architectural appearance of the door while improving the locks functionality and ease of use. The lock chassis is essentially functions as an electrical ground.

While additional wires (e.g., a three wire system could be used: one wire for power, one wire for data, and one for ground) could be routed to the appropriate circuitry, the single conductive wire 32, which the Touch Memory™ provides, is significantly easier to route through rotating members of mechanical locks. Moreover, using protocol described below, the communication is virtually error free. This scheme packetizes the data and uses Cyclical Redundancy Checks (CRC) to validate data. A detailed description of the protocol is found in a pamphlet entitled "DS19xx Touch Memory Standards Book", which is herein incorporated by reference.

Regarding FIG. 8, FIG. 8 is a cross-sectional view of lock core face plate 28 positioned in front of core 24 (facing the outside). Cell 3 has an outer contact face (as shown) that preferably has a unique serial identification symbol 38. This symbol (or number) can be logged by associated electrical mechanisms in the locks and be date and time stamped, so that information regarding the nature of access can be stored. Please note that cell 3 has the same outside diameter ("OD") as a core lock 24, which is 16 mm or approximately ⁶⁄₁₀ths of an inch. Cell 3 has been designed to easily mate the outside diameter of standard locks, such as door locks, cabinet locks, and desk locks, which generally have the same diameter core. Core 24 provides a shallow cup for cell 3. In most door lock applications, the actual core is recessed slightly from the outside of the handle to the knob providing a shallow cup 29, which can also be shaped to mate with cell 3. Please also note that since the Touch Memory™ module 3 itself does not require insertion, it will operate and open the lock, regardless of whether slot 34 is clogged. As a result, the electrical and mechanical keys could easily back up one another.

Figure 11:
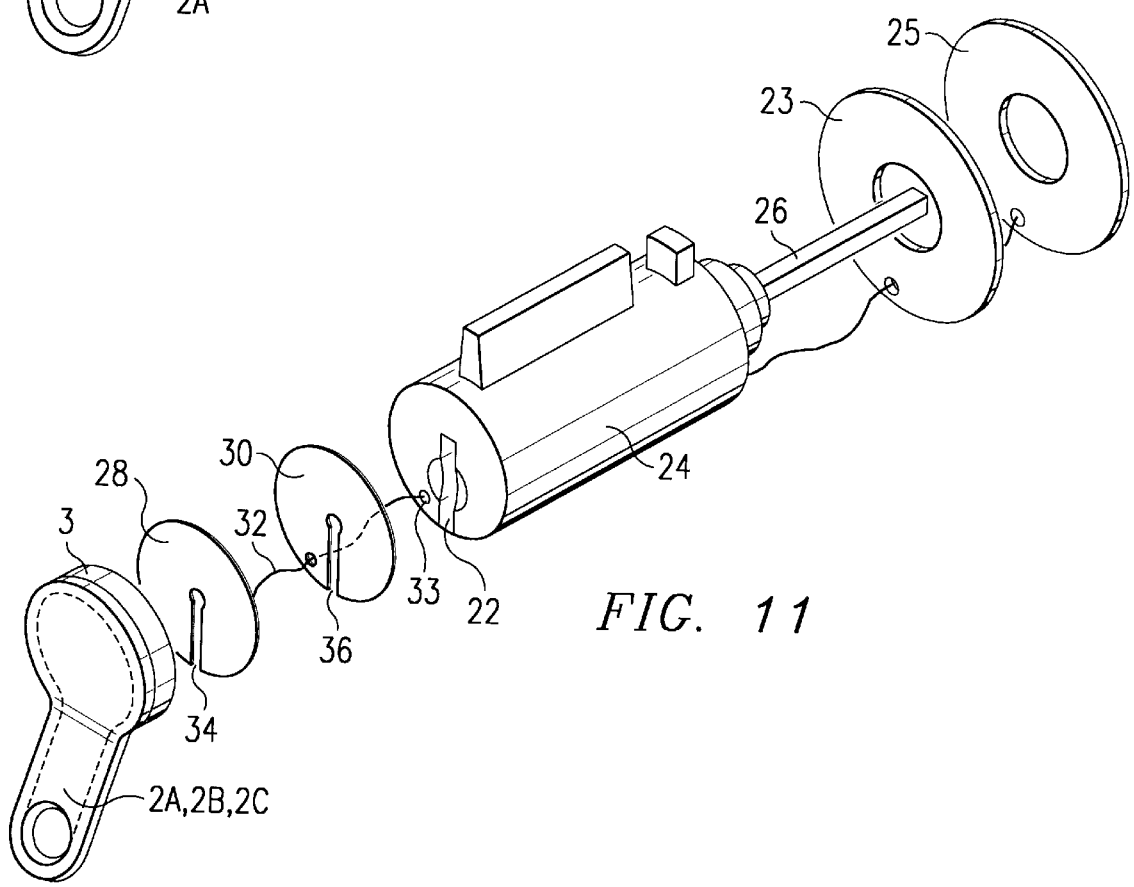
FIG. 11 is another illustration that shows how the electrical contact is reached to the back of the lock core 10 in FIG. 9.

In FIG. 11, the data probe contact 28 is soldered to conductive wire 33. Insulating washer 30 contains a hole which wire 33 goes through. The lock core and cylinder also contain a hole which insulated wire 33 goes through and comes out on the back side of the lock. Also it should be noted, that plastic washer 23 and 25 also contain a hole where this same insulated wire 33 is run. There is an electrical signal which can be isolated and electrically transmitted therefore from data probe contact 28 through body 24 and end up on the metal slip ring 25 on the back side. Plastic shoulder washer 23 electrically isolates the metal slip ring 25 by protecting the inner edge of the hole in the washer as well as the front face from making contact with other surfaces.

Figure 12:
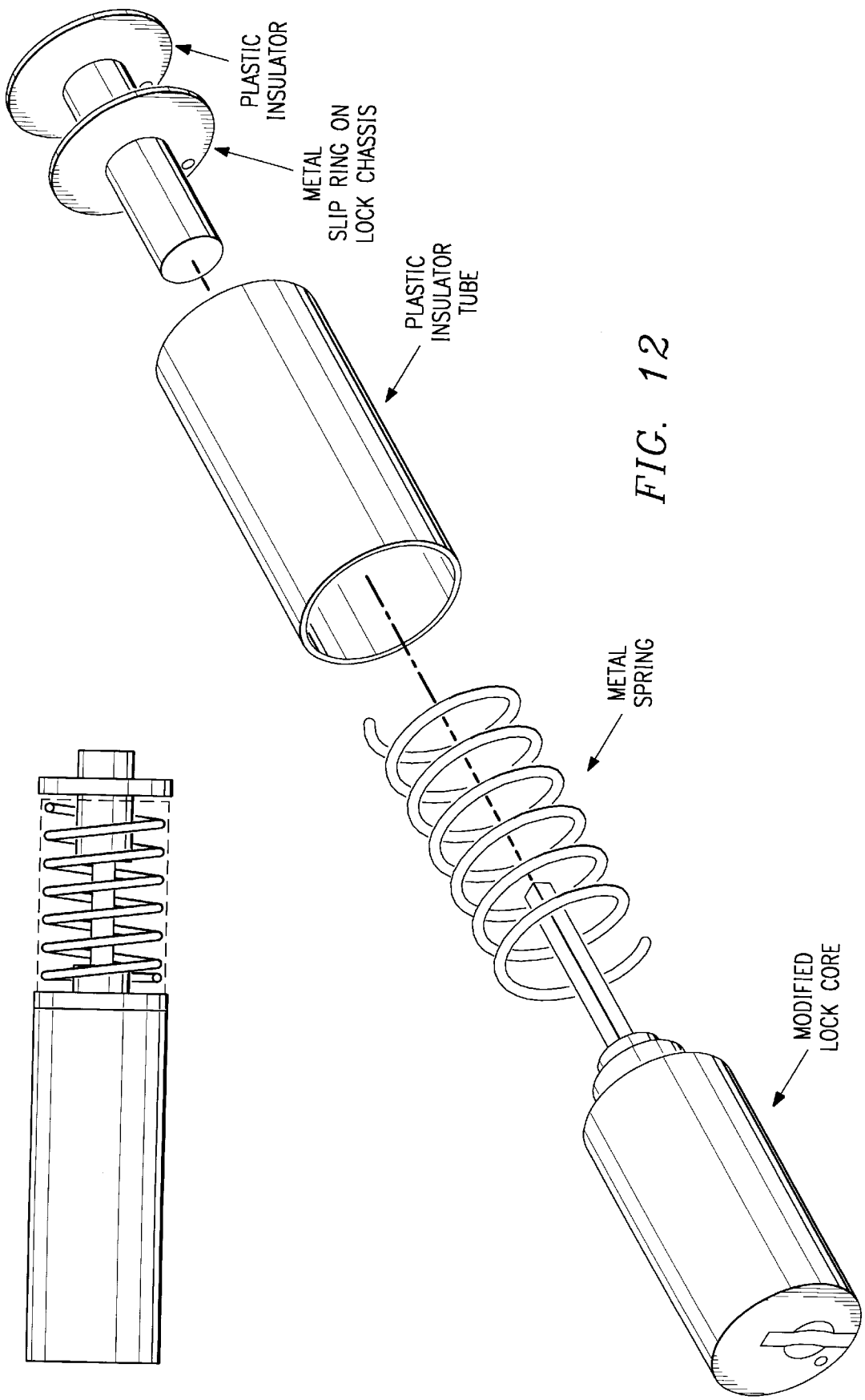
FIG. 12 is an illustration showing how the electrical contact is reached from the back side of the lock core, which can rotate, to a stationary conductive (e.g., metal) contact, which is electrically isolated from the lock chassis, which is preferably inserted in FIG. 9.

FIG. 12 shows a fully assembled modified lock core with a metal spring, a plastic tube and additional metal slip rings and plastic shouldered washer. The modified lock shown in FIG. 11 at the front has a signal which goes from the front of the modified lock core face 28 and is again wired all the way back to the metal slip ring 25. Given that assumption, the metal spring shown in FIG. 12 makes contact with metal plate 25 from the modified lock core and also makes contact with the metal slip ring on the back side of FIG. 12. The plastic shouldered washer makes sure that the metal spring does not make contact with the metal shaft that obviously sticks out of the back of the modified lock core or with any other parts. The plastic insulator tube keeps the outer edges of the metal spring from contacting other portions in the lock. There is a wire which is not shown which will be hand drawn in which is soldered into the metal slip ring and run back through the plastic shoulder washer. This then completes the electrical circuit from the front face back to the stationary electronics. In this design, the modified lock core can rotate about its center access in any number of ways. The signal is guaranteed through the use of the slip ring at the back side of the modified lock core and at the metal slip ring at the back side of where the plastic tube. Therefore the rotation here does not effect the nonrotation of the stationery electronics and other electronic lock parts.

FIG. 13 is an illustration showing an alternate embodiment of Touch Lock™ lock 122A, 122B, 122C, etc. In particular, please note the alternate mechanism to string electrical contact 32 through or actually around lock core 24 through the grooved sleeves. Contacts 32 are surrounded by an insulator to prevent the electrical contact 32 from being shorted out to lock core 24. This embodiment uses a multi-chip electronics.

FIG. 14 is an illustration showing an alternate embodiment of Touch Lock™ lock 122A, 122B, 122C, etc. In particular, please note the alternate mechanism to string electrical contact 32 through or actually around lock core 24 through the grooved sleeves. Contacts 32 are surrounded by an insulator to prevent the electrical contact 32 from being shorted out to lock core 24. This embodiment was a single-chip electronics for STRIAN relief in place of the metal spring slip ring.

Figure 16:
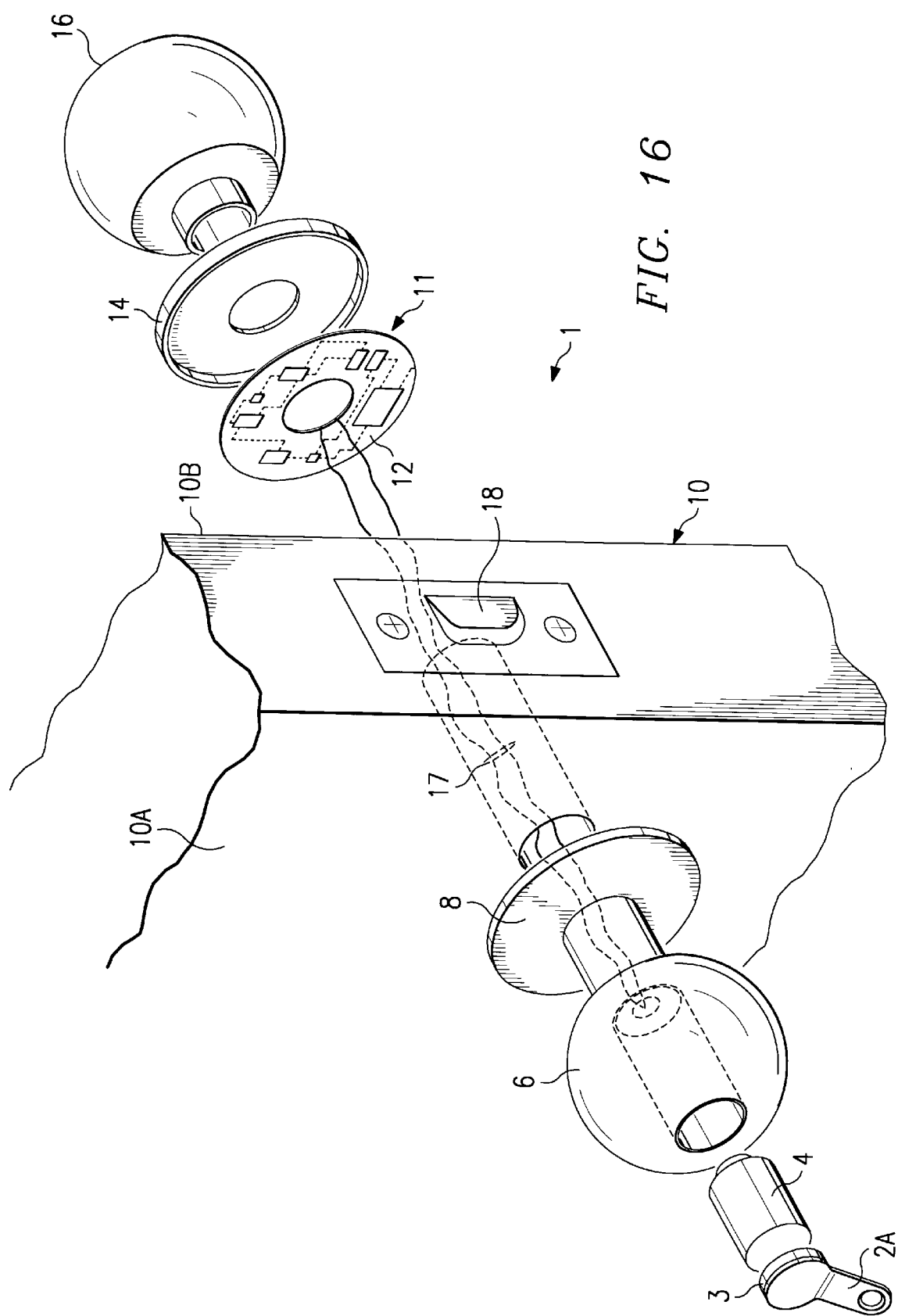
FIG. 16 is an illustration showing an all electric lock of Touch Lock™ lock 122A, 122B, 122C, etc. illustrating the standard wired mechanism of providing an electrical contact from the Touch Memory™ face through the power pack 4 to multi-chip version electronics 11.

FIG. 15 is an illustration showing an all electric lock of Touch Lock™ lock 122A, 122B, 122C, etc. illustrating yet another alternate embodiment (e.g., insulated cable) of providing an electrical contact from the Touch Memory™ face through the lock core to single-chip version of electronics 11. In particular, FIG. 15 is an illustration showing an all electric lock of Touch Lock™ lock 122A, 122B, 122C, etc. illustrating the insulated cable wired of providing an electrical contact from the Touch Memory™ face through the lock core to multi-chip version of electronics 11. FIG. 16 shows the overall system comprising electrical locking and unlocking mechanisms, which is generally denoted by reference number 1. Although the access control system 1 shown in FIG. 16 is a stand-alone access control system, it is possible to interconnect or link the electronics in FIG. 16 with additional circuitry or systems (e.g., personal computers, work stations, etc.) (not shown) that can be used to monitor the access to areas secured by door 10. Improved door locks 122A, 122B, etc. positioned on a traditional door 10 having a first surface 10A (e.g., an outside or front surface) and a second surface 10B (e.g., an inside or back surface) and extends through door 10 from first surface 10A to second surface 10B. First knob 6 is attached to first face plate 8. Both first knob 6 and first face plate 8 are positioned on first surface 10A. Second knob 16 is attached to second protective plate 14. Both knob 16 and second face plate 14 are positioned on second surface 10B. Second face plate 14 covers and protects electrical circuitry 11 found on printed circuit board 12. Like second protective plate 14, printed circuit board 12 is circular in shape and has a hole in the middle to permit access to second knob 8. Key 2 houses cell 3 which electrically couples with power pack 4, which is, in turn, electrically coupled via dotted path 17 with circuitry 11 on printed circuit board 12.

FIG. 16 is an illustration showing an all electric lock of Touch Lock™ lock 122A, 122B, 122C, etc. illustrating the standard wired mechanism of providing an electrical contact from the Touch Memory™ face through the lock core to multi-chip version of electronics 11. FIG. 16 shows the overall system comprising electrical locking and unlocking mechanisms, which is generally denoted by reference number 1. Although the access control system 1 shown in FIG. 16 is a stand-along access control system, it is possible to interconnect or link the electronics in FIG. 16 with additional circuitry or systems (e.g., personal computers, work stations, etc.) (not shown) that can be used to monitor the access to areas secured by door 10. Improved door locks 122A, 122B, etc. positioned on a traditional door 10 having a first surface 10A (e.g., an outside or front surface) and a second surface 10B (e.g., an inside or back surface) and extends through door 10 from first surface 10A to second surface 10B. First knob 6 is attached to first face plate 8. Both first knob 6 and first face plate 8 are positioned on first surface 10A. Second knob 16 is attached to second protective plate 14. Both knob 16 and second face plate 14 are positioned on second surface 10B. Second face plate 14 covers and protects electrical circuitry 11 found on printed circuit board 12. Like second protective plate 14, printed circuit board 12 is circular in shape and has a hole in the middle to permit access to second knob 8. Key 2 houses cell 3 which electrically couples with power pack 4, which is, in turn, electrically coupled via dotted path 17 with circuitry 11 on printed circuit board 12.

FIG. 17 is a cross-sectional diagram of Touch Memory™ lock 122A that illustrates how battery pack 4 is inserted and interacts with the rest of the lock. Battery pack 4 is inserted in and actually has an indentation on the front for where the Touch Memory™ data contact is located. On the back side, there is an indentation and lip. There is a plate in FIG. 18 which describes what the end cap on the back side looks like. Looking at the view from the back side, there is a concentric rings which made up with the contact which is soldered to the date and power lines. This contact plate is mounted on a spring which provides the force mechanism to make contact to the battery pack. The battery pack is pushed in opposing this spring. The spring clip is referred to as retaining clips are pushed apart by the insertion of the battery pack and when the battery pack is fully reached the back area in the lock, the clip spring out and lock into place. On the spindle of the locking mechanism, there will be two opposing holes. A small probe will be inserted simultaneously on each side which will depress the retaining clips allowing the spring with the mounted data contact to expel the power pack module.

More specifically, regarding Power Pack 4, FIGS. 18A, 18B, AND 18C are exploded views of power pack 4 (as shown in FIGS. 16 and 17). Power pack 4 has a first end 11 and a second end 13. Power pack 4 is cylindrical in shape and housed in knob 6. Power pack 4 is comprised of probe 4A and battery cell 4B. Probe 4A is positioned in front of battery cell 4B and functions as a data contact. Probe 4A is preferably attached to battery cell 4B (e.g., glued to battery cell 4B). Battery cell 4B is preferably a lithium cell (which is low cost, readily available, and energy intensive), but could also be silver oxide and a host of other battery types. Lithium cells are typically found in many modern 35 mm battery packs and are approximately ⅔rds of the standard length of a standard sized A cell or ⅔rds of the standard length of a standard sized AA cell. Conductive wire 4C connects to probe 4A and is coupled to electrical path 17. In particular, conductive wire 4C contacts probe 4A and is positioned adjacent and alongside battery 4B to an end cap (not shown).

FIG. 18B shows a cross-sectional view of an adaptor pad attached to a second end of power pack assembly 4. In particular, battery pack 4 has three contact rings; a power 5 in the center, a ground 7 on the outside or perimeter, and a data line 9 positioned in a center ring between power 5 and ground 7. Data line 9 is electrically coupled and communicates with memory in key 2A.

FIG. 18C shows power pack assembly 4, which fits in a cylindrical volume found in most traditional door locks. This cylindrical volume holds the hollow cores that houses mechanical tumblers in traditional door knobs. Power pack 4 powers key 2 and electrical circuitry 11 found on printed circuit board 12, which mobilizes mechanical locking system to withdraw door jam 18. In addition, power pack 4 is replaceable and capable of being removed and replaced without unlocking and unlatching door 10. In other words, power pack 4 can be physically removed and replaced without ever gaining access to the restricted area door 10 helps enclose.

Please note that the energy consumption in preferred embodiments is low, which contributes to long battery life of battery pack 4. Cell 3 of key 2 requires very little (if any—depending on the construction of cell 3) battery pack 4 to operate. Battery pack 4 supplies power to the face of the probe 4A for reading memory in cell 3, but this is primarily used for communication purposes as opposed to powering the chip. Approximately 2 mils is required for communication. The only other items requiring power are circuitry 11 located behind door 10 and electronic solenoid (not shown), which activates and deactivates the locking mechanism (not shown).

Figure 19:
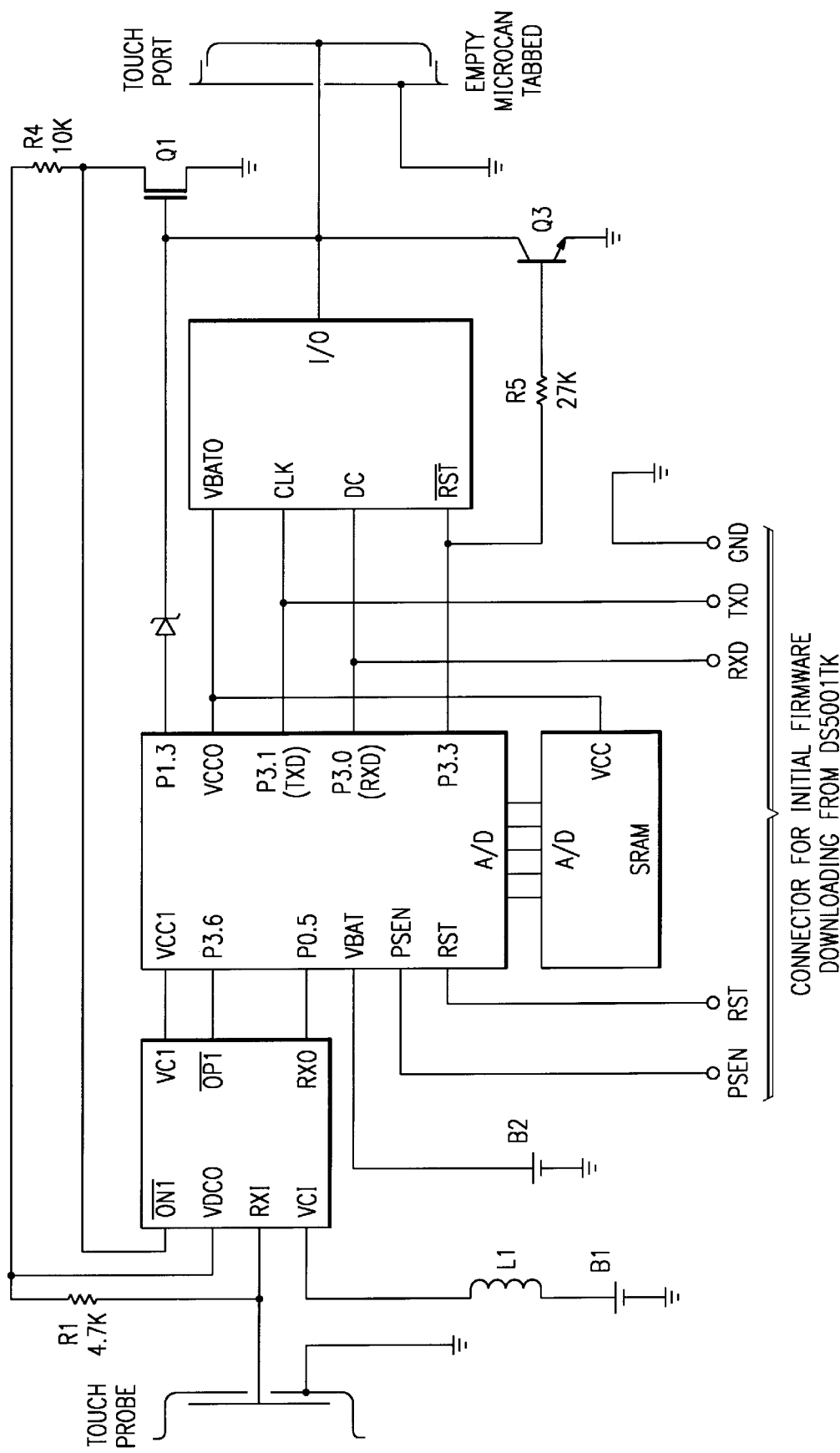
FIG. 19 is a block diagram of a multi-chip electronics 11 shown in FIGS. 6, 9, 13, and 16.

FIG. 19 is the general function that the electronics consist of four ICs with support discrete components. There is the DS1227 power management chip, the DS5001 microcontroller, the DS2404 time clock and a SRAM which is the DS2257s. The block diagram shows the general workings of how these chips interplay to perform the locking and unlocking function.

Figure 20A:
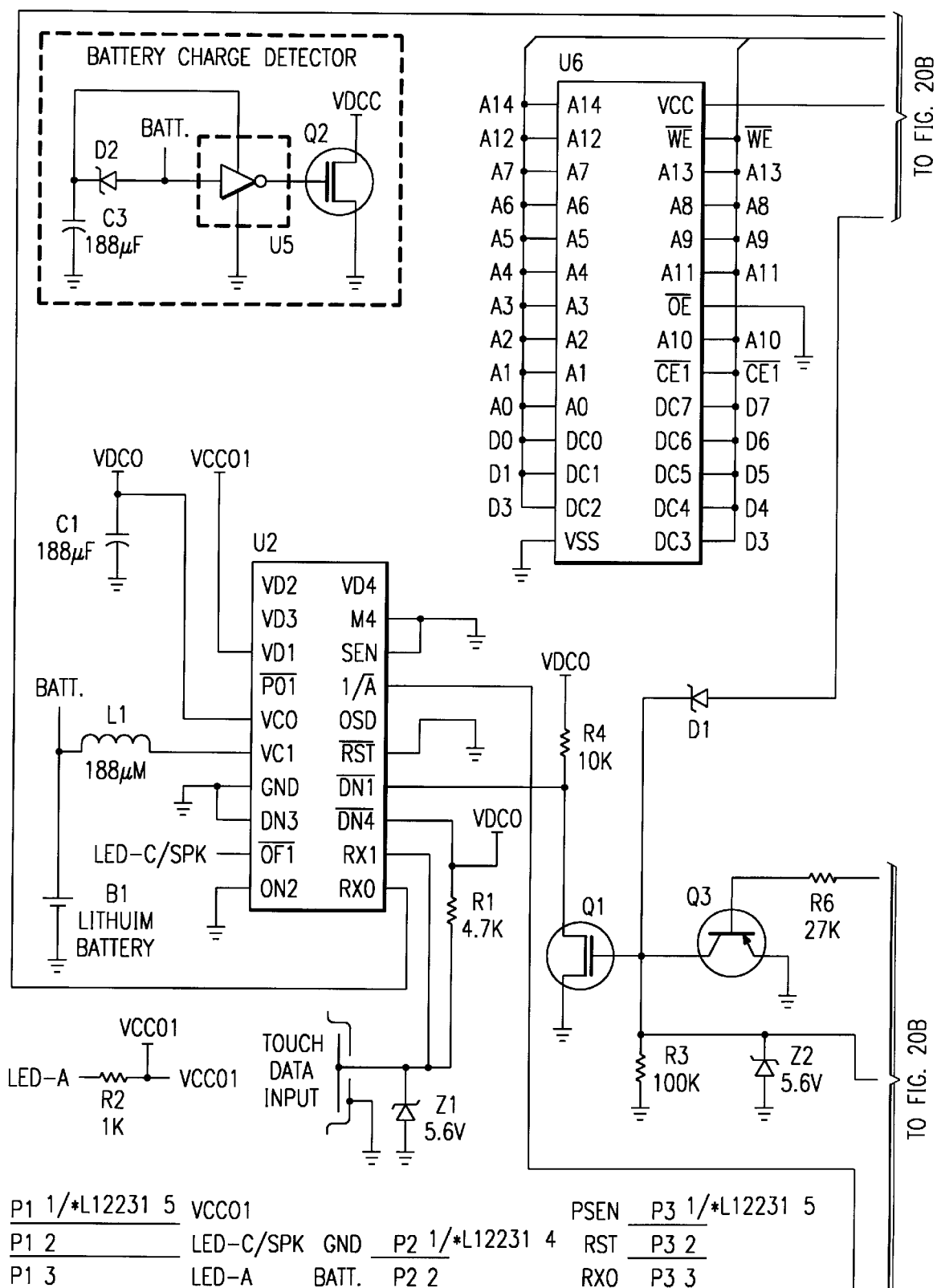
FIG. 20A is the corresponding circuitry of the block diagram of the multi-chip electronics 11 shown in FIGS. 6, 9, 13, and 16 that can be combined into a single-chip embodiment.
Figure 20B:
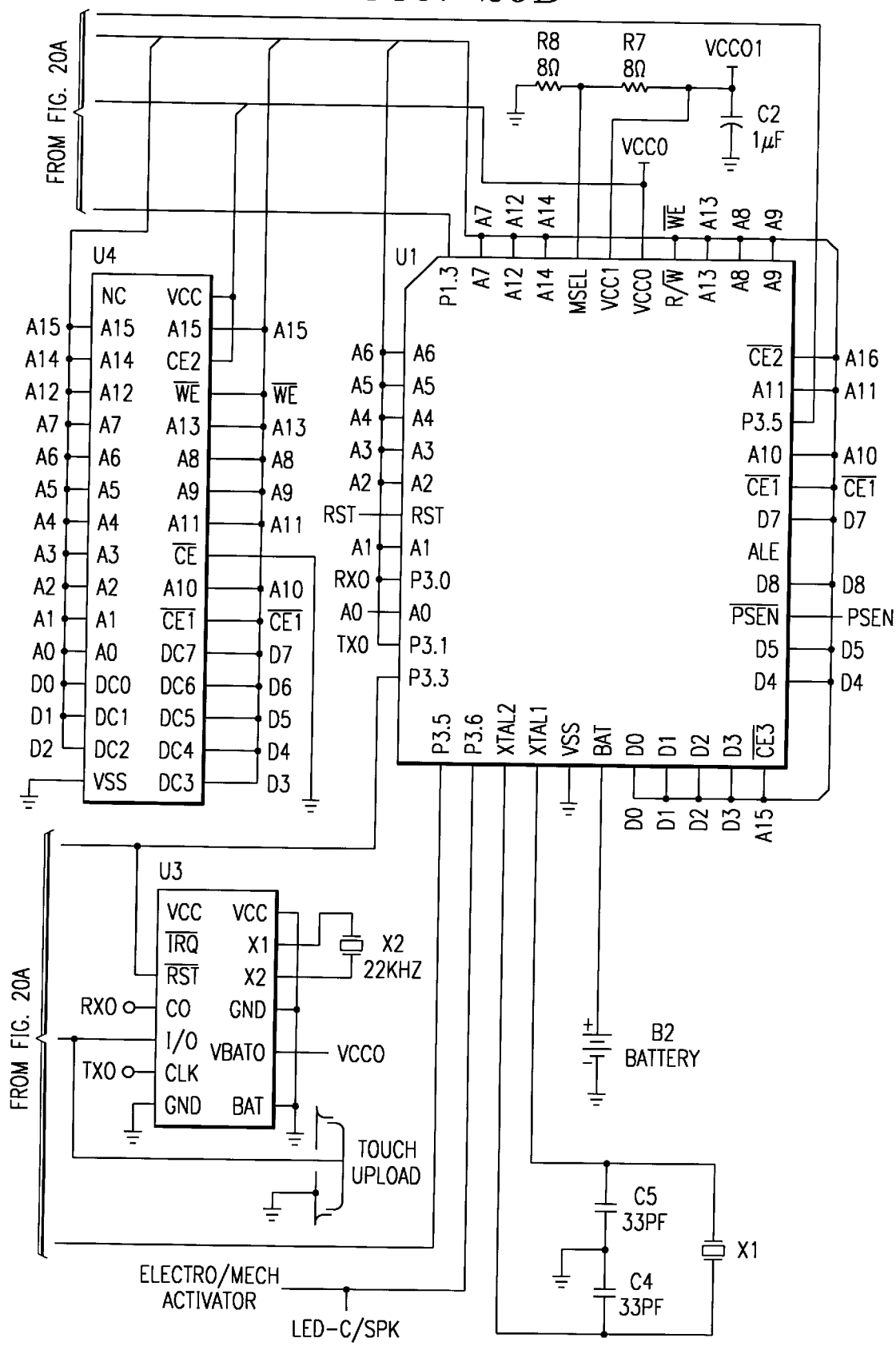
FIG. 20B is corresponding circuitry of the block diagram of the multi-chip electronics shown in FIGS. 6, 9, 13, and 16.

FIGS. 20A and 20B form the schematic of the Touch™ lock. It should be noted that in FIG. 20B, the signal LCD/SPK is derived from the output off of U2 which is in the schematic, the ON function 1 bar. U2 is device DS1227. Software in the lock uses this signal to energize the solenoid which is driven by U1A 74H00.

Figure 21:
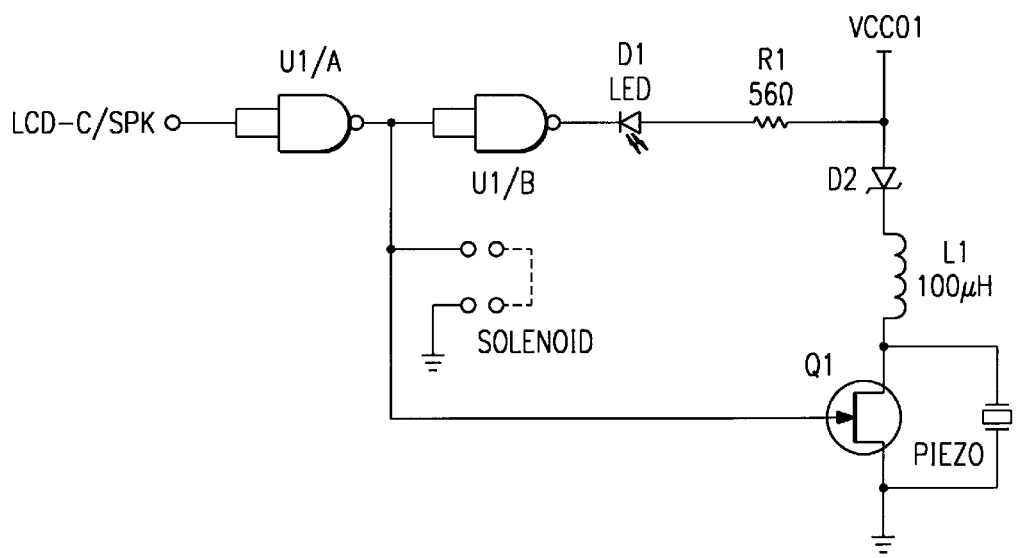
FIG. 21 is a circuit diagram.

FIG. 21 is schematic for a Touch Pen™.

FIG. 22 is a series of cross-sectional diagrams of the Master Keying Device shown in FIG. 1 and FIG. 5. A Master Keying Device is a portable MicroLAN™ of various Touch Memory™. The minimum configuration of a Master Keying Device is one DS1991, one DS1994 and one other Touch Memory™ such as a DS1992 or DS1993 which will be used for bulk memory storage. In addition, there are seven devices that can be either DS1990As or 2401 serial number devices. These seven serial number devices are connected in parallel to a rotary functional switch or some other switching mechanism which has the ability to put one of these devices on the MicroLAN™ at any one moment in time. In addition to that, the MicroLAN™ is terminated with a Touch port, DS9092R. When the MKD is presented to the lock, the lock electronics will seed the 1991, the 1994 the bulk memory and one of the serial numbered devices. The electronics then goes to interrogate subkeys 0, the 1991 to see if it is in fact a MKD and if so, what function is called out by the serial number which is on the bus. Each particular serial number corresponds to one of seven functions. One is open, another is add a key, delete a key, clear all keys from memory, load a new list of valid users, collect the audit trail, and recalibration of time. The two figures below it show two alternate embodiments of these devices. One could be held in a cylinder tube where the devices are stacked on top of each other and the other option shows a plastic case which has some resemblance to the Touch key probe.

FIG. 23 is an enlarged view of key 2A, which comprises a cell 3. FIG. 23 Shows an enlarged view of key 2, which comprises a cell 3. As shown in FIG. 23, cell 3 is preferably a Touch Memory™ module. Also note that key 2 also has a hole, positioned so that key 2 can fit on a normal key ring. Using Touch Memory™ modules or tokens (the operation of which will be explained in more detail below) provides a number of advantages, which will be discussed hereinbelow under the heading Touch Memory™ technology. In addition, as shown in FIG. 6D, key 2 is comfortable to carry and complements traditional mechanical keys on traditional mechanical key structures. Key(s) 2 having Touch Memory™ modules are easier to use and are more secure than traditional metal keys.

In particular, Touch Memories™ may be labeled or coded (permanently or temporarily) with a unique registration number. Circuitry 11 simply compares the registration number recorded on corresponding to each Touch Memory™ module 3 on each key 2 to an internal list of registration numbers that correspond to all valid users stored in memory on circuitry 11. Given the fact every Touch Memory™ module has a unique identity, the resulting system (shown in FIGS. 1A) has the added benefit of being able to provide an audit trail feature, which therefore qualifies it as a stand-alone access control system. Moreover, given the fact key 2 is electronic, the registration number stored on each Touch Memory™ module 3 can be changed electronically in seconds without the addition or removal of any parts.

Figure 24:
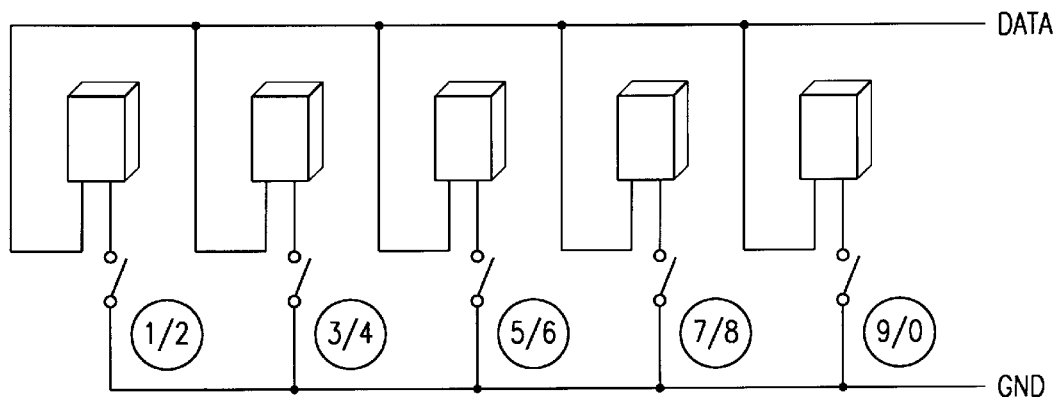
FIG. 24 is diagram showing the one-wire key pad.

FIG. 24 is diagram showing the one-wire key pad. In this configuration using the same MicroLAN™, a key pad can be configured either in parallel or in a matrix configuration such as in a regular telephone. In the schematic shown, when a switch is depressed, that particular serial number DS2401 or 1990 is brought on the bus. Assuming the bus is active, meaning the data line is held high, the device will issue a presence detect signalling to the host PC or lock electronics to go out and look up which device caused the presence detect. Each device can correspond to one number of an array where two devices could correspond to a particular button that was pressed. It should be noted that it is not shown in this schematic but a DS2502 could be used as a directory to give a correlation as to what button or serial number for each 2401 is and what the corresponding serial number or serial numbers corresponding to the button pressed is. This will allow you to take this device and plug it on to any one-wire bus such as the main system configuration 100 or 1000 that is shown and the 2405 will have a file structure such as described for the door controller modules where there is an F-map function as well as a lab.000 describing what the device that it added to the bus is.

Figure 25:
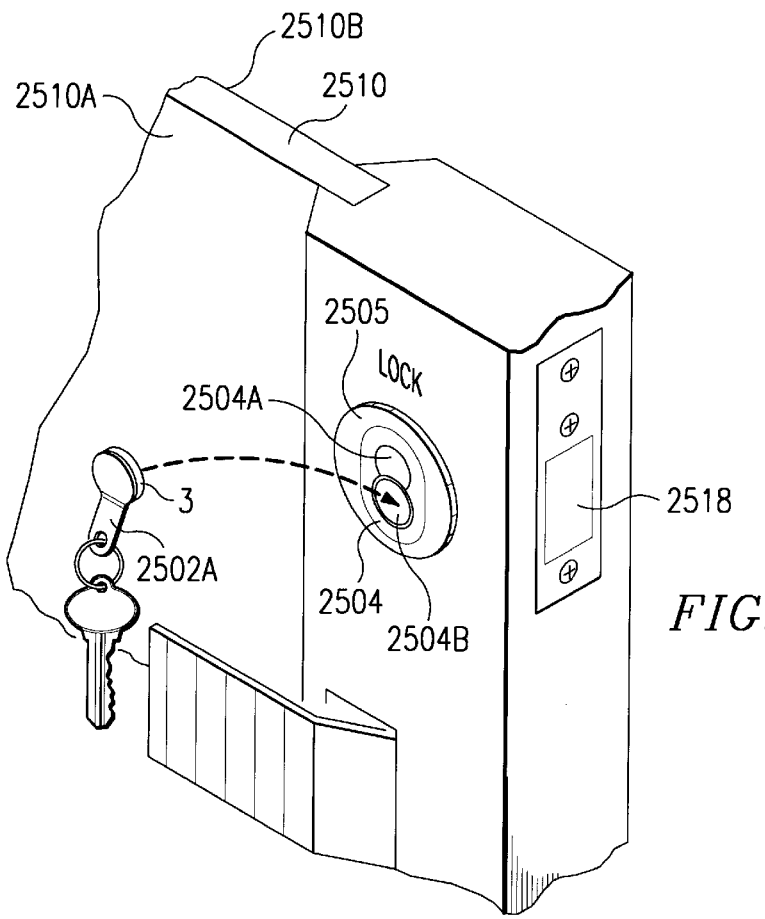
FIG. 25 shows an alternate preferred embodiments of the entirely electric version for a deadbolt lock 2510 of the access (keying) systems electric door knob 2606 of the access (keying) systems that provides a removable locking cylinder 2504 and key probe contact.

Referring again to FIGS. 15 and 16, preferred embodiments using TOUCH MEMORY™ access mechanisms in which the access (keying) systems are entirely electric. As discussed above, while the electric keying methods can be combined with traditional mechanical locking systems, alternate preferred embodiments are entirely electric. The preferred approach provides an electrical contact from the face of TOUCH MEMORY™ key 2A, 2B, and 2C through the power pack 4 to the electronics 11 to unlock the door 10. Similarly, referring to FIG. 25 and 26, alternate preferred embodiments of the entirely electric version of the access (keying) systems, are shown. Once again, as has been discussed above and will be discussed below, the electric keying methods can be combined with traditional mechanical locking systems. FIG. 25 shows an all electric version of a deadbolt lock 2505 having locking cylinder 2504B, which has a battery pack 2504A preferably attached to locking cylinder 2504B and positioned on top, so that the entire assembly of cylinder 2504 creates a "figure 8" appearance from the front, which combines a large amount of functionality with little amounts of space. Note the deadbolt lock 2505 is positioned on a door 2510, which serves as a barrier to entry, having a first surface 2510A (e.g., an outside or front surface) and a second surface 2510B (e.g., an inside or back surface) and extends through door 2510 from first surface 2510A to second surface 2510B. Key 2502A houses cell 3 which electrically couples with power pack 2504, which latches and unlatches door latch 2518.

Figure 26:
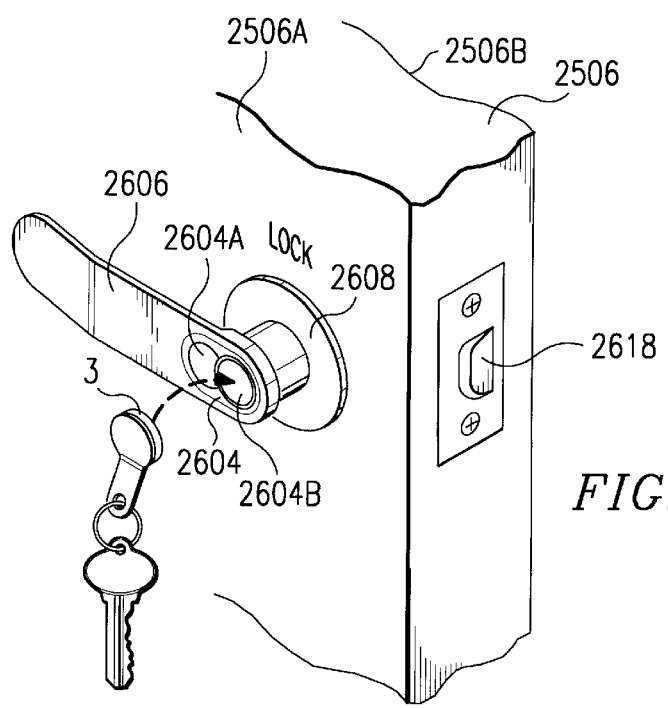
FIG. 26 shows an alternate preferred embodiments of the entirely electric version for an electric door knob 2606 of the access (keying) systems that provides a removable locking cylinder 2604 and key probe contact.

As shown in FIGS. 27 and 28, the "figure 8" shape of the cylinder 2504 can also be easily retrofitted into existing mechanical locks, particularly deadbolt locks, such as that shown in FIG. 16 (but also other locking apparatus having lock cores, such as door knobs like that shown in FIG. 26, and safe lock cores, cabinet lock cores, vehicle lock cores (e.g., automobile or air planes), lock boxes, real estate lock boxes, bicycle lock, vending machine lock boxes, pay phone lock boxes, parking meter lock boxes, etc.). FIG. 27 shows a traditional lock core 2704 for a traditional dead bolt lock 2704 used with a mechanical keys 2702. FIG. 28 shows the all electrical lock core 2504 and battery pack 2504A preferably attached and positioned adjacent to locking cylinder 2504B, both of the type shown in FIG. 25. As shown in FIG. 28, locking cylinder 2504B is preferably comprised of a DC motor 2509 to actuate a reducer gear head to latch and unlatch latch 2518 (in FIG. 25). As shown in FIG. 28, battery pack 2504A comprises a 3V lithium cell 2515 and electronics 2517 placed therein to power and control DC motor 2509 to actuate reducer gear head 2511 to latch and unlatch latch 2518 (in FIG. 25). Note electrically lock core 2504 easily fits inside mechanical lock core 2704, so that it can be easily retrofitted into existing mechanical locks without replacing the latching and unlatching mechanism already in place. In addition, note that while not shown in FIGS. 25, 26, 27, and 28, the electrical lock core 2504 can be combined with existing mechanical lock cores and the two actuating techniques can be combined and peacefully coexist, using any one the mechanisms discussed at great length above. FIGS. 29A, 29B, and 29C shows alternate perspective views of all electrical lock core 2504 and battery pack 2504A preferably attached and positioned adjacent to locking cylinder 2504B, both of the type shown in FIG. 25. FIG. 29A is essentially FIG. 28 and was simply shown together with FIG. 29B and 29C for association and reference purposes. FIG. 29B is a front view. Note the first contact 2905 (e.g., ground) and second contact 2907 (e.g., data, clock, power) for circuit 2503 (in FIG. 25) and 2603 (in FIG. 26). FIG. 29C is a cross-sectional view. Dimensions are shown in the drawings themselves.

FIG. 26 shows an all electric version of a door knob lock 2506 having locking cylinder 2604B, which has a battery pack 2604A preferably attached to locking cylinder 2504B and positioned on top, so that, like 2504 in FIG. 25, the entire assembly 2604 creates a "figure 8" appearance, which combines a large amount of functionality with little amounts of space. Note, as discussed above in reference to FIGS. 27 and 28, this shape can also be easily retrofitted into existing mechanical locks found in door knobs and levers as well (which will be combined and referred to as a knob for this discussion). Note the lock 2605 is positioned on a door 2610, which serves as a barrier to entry, having a first surface 2610A (e.g., an outside or front surface) and a second surface 2610B (e.g., an inside or back surface) and extends through door 2610 from first surface 2610A to second surface 2610B. Knob 2606 is attached to first face plate 2608. Knob 2606 and face plate 2608 are positioned on first surface 2610A. While not shown, like FIGS. 15 and 16, a second knob along with a protective plate, which may also provide access for a key, may be positioned on second side 2610B. Key 2602A houses cell 3 which electrically couples with power pack 2604, which latches and unlatches door latch 2518. Also, that the discussion pertaining to the electrical lock core 2504 regarding FIGS. 27, 28, and 29A, 29B, and 29C applies to the lock core 2606 as well.

Regarding the performance of the electrical lock cores, such as that shown in FIGS. 25, 26, 27, 28, and 29A, 29B, and 29C, the 3V lithium battery 2515 generally provides energy for approximately 10 years of operation. Likewise, as discussed above in the operating protocol of preferred embodiments, preferred embodiments provide a high level of convenience to the user. In particular, using TOUCH MEMORY™ technology, preferred embodiments provide a response to the user (in the form of tactile, audio or visual feedback) within 250 mS (maximum) from the time the key makes first contact with the lock. The speed which preferred embodiments unlocks will be 750 mS for normal operation. Slower speeds are acceptable as the energy level in the battery decreases. Preferred embodiments will operate between −40 C. and +85 C. The storage temperature of the lock, excluding the battery is −55 C. to +125 C. With the battery installed, the operational and storage temperature are the same. Preferred embodiments will be available in a number of models which build on its core benefits of security and convenience. These locks have additional features which include: an audit trail, MICROLAN™ compatibility and a serial communication port (TTL level RS-232).

Figure 30:
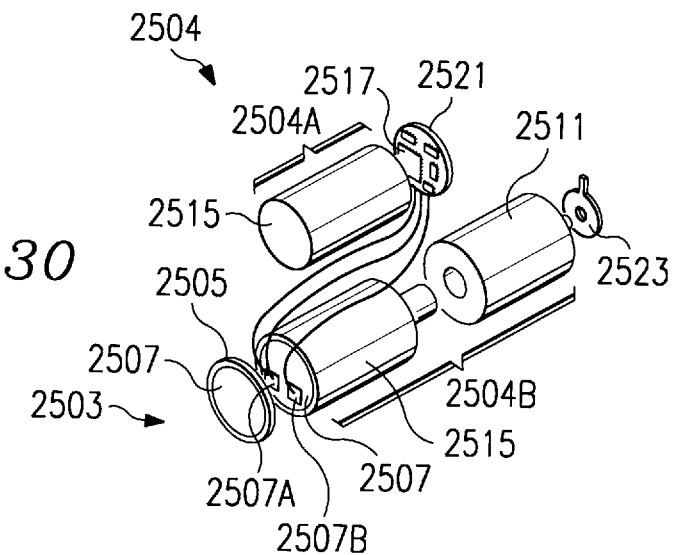
FIG. 30 shows alternate preferred embodiments of the lock core 2504 (and 2506), all of which can be easily retrofitted into existing mechanical locks, but have a number of varying features.

Referring again to the electrical lock core 2504 and 2604 shown in FIGS. 25 and 26 respectively and the lock core 2504 shown in FIGS. 27, 28, 29A, 29B, and 29C, a number of alternate preferred embodiments exist. All preferred embodiments can be packaged in the "figure 8 package" discussed above and, thus, can be easily retrofitted into existing mechanical locks. An alternative to the "figure 8 package" is a replaceable handle (lever or knob). This package variation allows for the replacement of the old handle from an existing all mechanical lock set (it does not have to have an interchangeable core) with a replacement handle. Thus providing the same feature enhancements of the "figure 8 package" but in the larger handle volume. In particular, as shown in FIG. 30 the baseline model accommodates up to 15 user keys and one master key and rekeys in seconds without the addition or removal of parts. Rekeying can be accomplished either with a Master Control Key or by a Key Management system using a Master Keying Device. Similar to FIGS. 18A, 18B, and 18C, lock core 2504 is comprised of battery pack 2504A preferably attached and positioned adjacent to locking cylinder 2504B. Battery pack 2504A is also comprised of electronics 2517, which may exist in a multi-chip or single-chip packages 2519 mounted on a small printed circuit board 2521. 3V lithium cell 2515 powers the DC motor 2509 that actuates reduced gear head 2511. Probe 2505 is preferably comprised of a first contact 2505 (e.g., ground) and a second contact 2507 (e.g., data, power, ground). Second contact 2507 is electrically coupled to at least one contact pad 2507 (e.g., contact pads 2507A and 2507B) that is in turn electrically coupled to electronic circuitry 2517 mounted to printed circuit board 2521 by a conductive wire or alternate communication channel (e.g., Infrared, radio frequency). Multiple contact pads generally enhance the electrical communication. Likewise, first contact 2505 is also electrically coupled to electronic circuitry 2517 mounted to printed circuit board 2521 as well by a conductive wire or alternate communication channel (e.g., Infrared, radio frequency) . Electronic circuitry 2517 which implements TOUCH MEMORY™ technology is discussed in great detail above in reference to numerous schematics, as well in the host of references incorporated by reference, and will not be unnecessarily repeated here. Note that while preferred embodiments take advantage of the 1-Wire™ technology described above, which provides for a minimal number of contacts, alternate preferred embodiments may use a greater number of wires (e.g., 3 wires) in which the data, power, and clock signals may be unpacked to allow for greater speed. The entire assembly of lock core 2504 is held in place by locking pin 2523, which, as shown, has an open and close position.

Likewise, an alternate preferred embodiment can be achieved. An embodiment could, for example, accommodate up to 63 user keys and one master key, provides a visual indicator give the status of the transaction, and non-volatile memory sustains data in the event of a dead main lithium cell. In addition to the components shown in FIG. 30 and described in reference thereto, this embodiment can also be comprised of a first electronic module 2531 (e.g., DS1996) and a second electric module 2533 (e.g., DS1994). The DS1994 and DS1996 are two devices manufactured by Dallas Semiconductor Corporation, the datasheets of which are incorporated by reference. More specifically, the DS1994 provides a real time clock and nonvolatile memory for an audit trail. The DS1996 provides additional nonvolatile memory for storing larger amount so to audit trail data.

Figure 31:
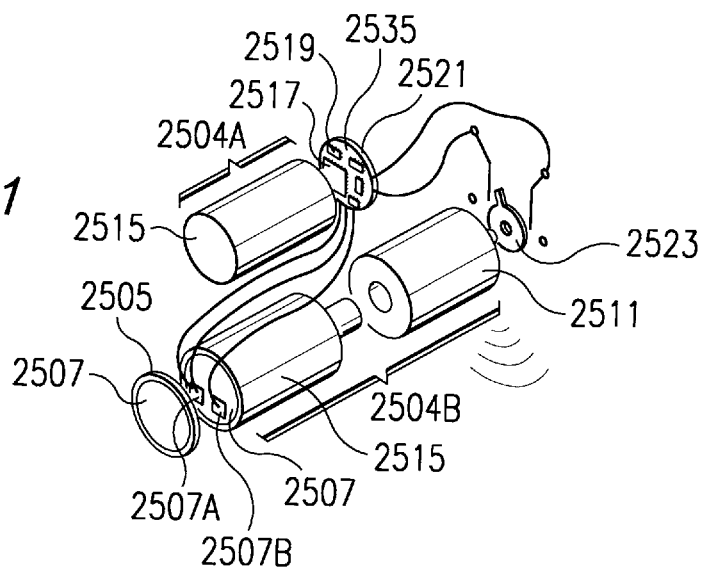
FIG. 31 shows an alternate preferred embodiment of a lock core.
Figure 32:
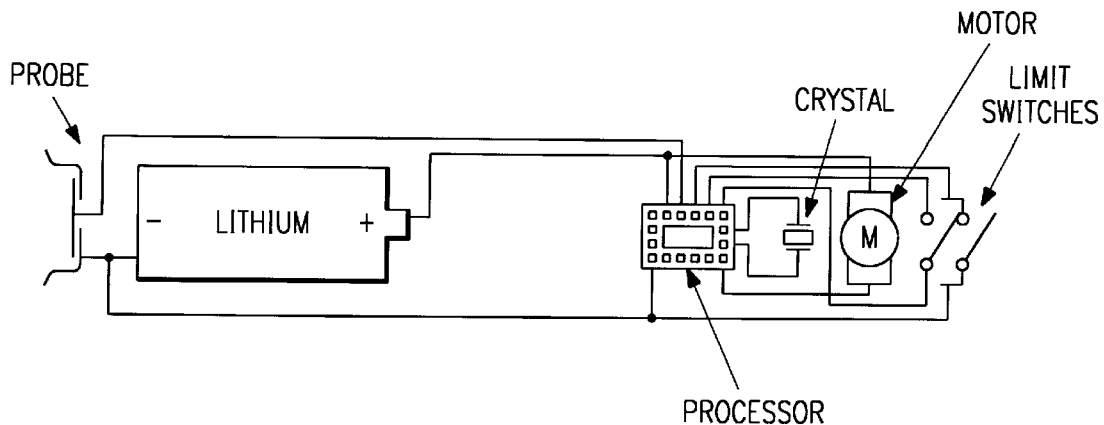
FIG. 32 shows the block schematic diagrams of the electronics 2519 found in FIG. 30 and 31 respectively.
Figure 33:
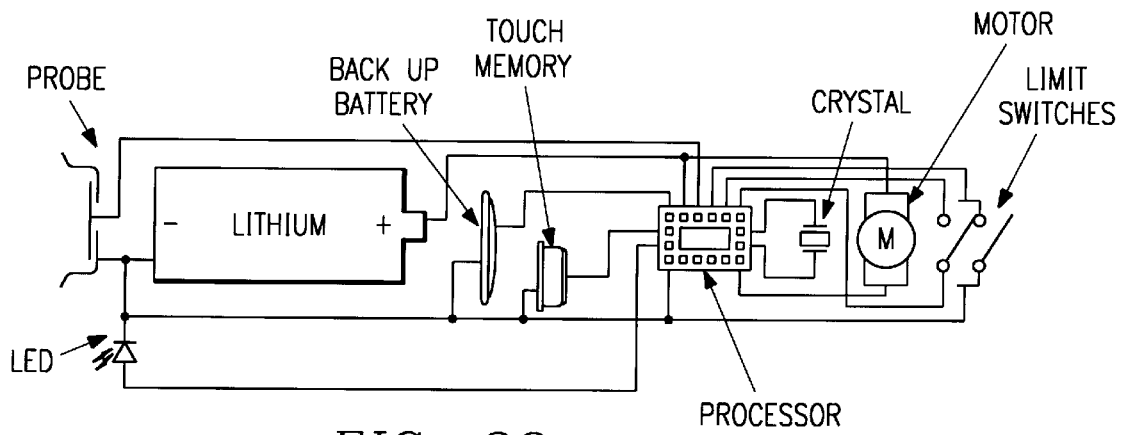
FIG. 33 shows a cross-sectional schematic of a lock core.
Figure 34:
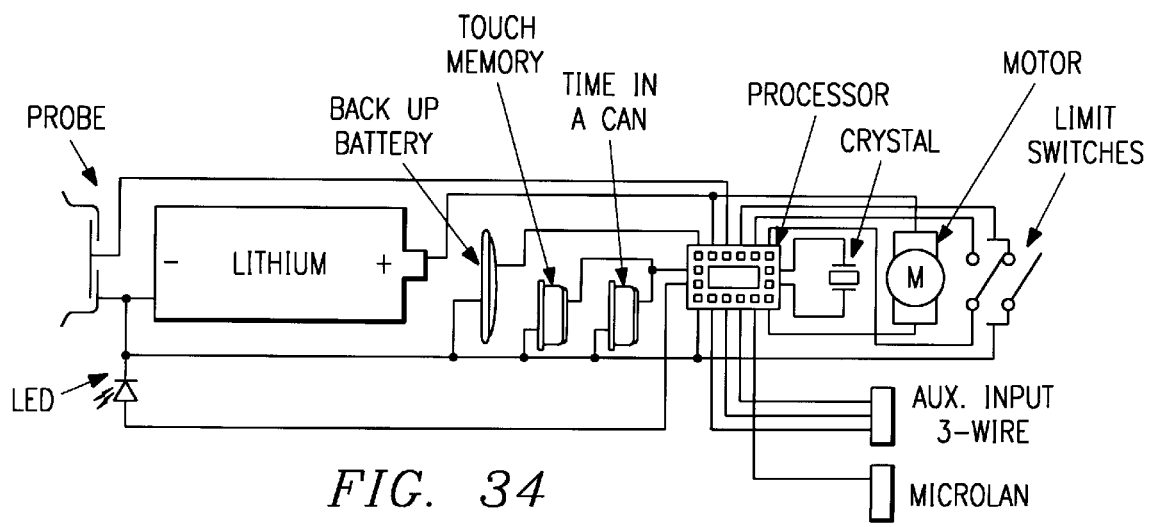
FIG. 34 shows a cross-sectional schematic of a lock core.
Figure 40:
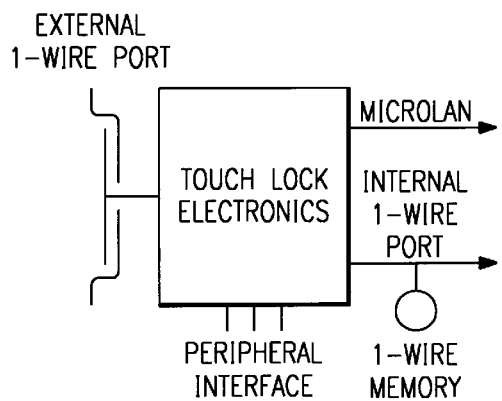
FIG. 40 show the optional electronic interfaces MICROLAN™, 1-Wire™, and periphery equipment to the preferred embodiments of electronics.
Figure 41:
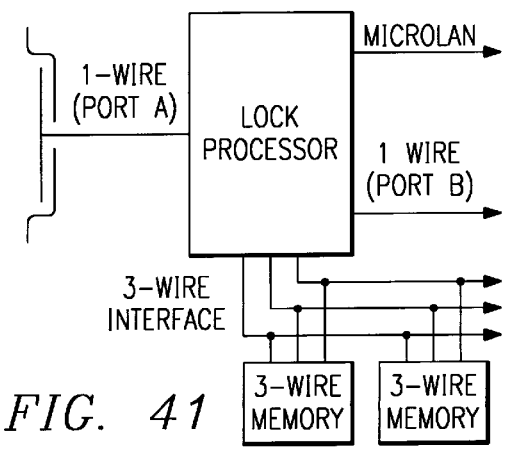
FIG. 41 show an example of how to interface the industry standard 3-wire bus to the preferred embodiment of electronics.
Figure 42:
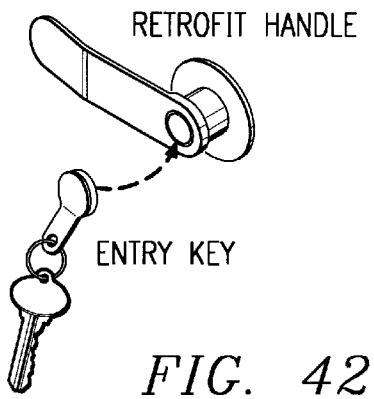
FIG. 42 shows an alternative package, a replacement handle (lever or knob) for the preferred embodiment.
Figure 43:
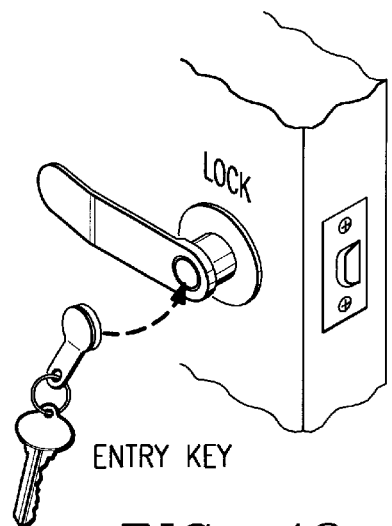
FIG. 43 shows the alternative package preferred embodiment installed on a previously all mechanical lock set.
Figure 44:
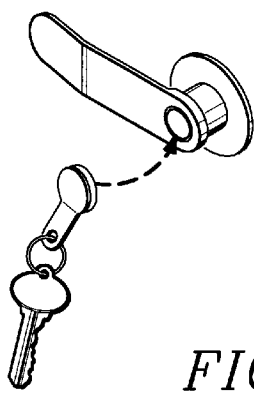
FIG. 44 shows the alternative package in the lever and knob form factors.
Figure 45:
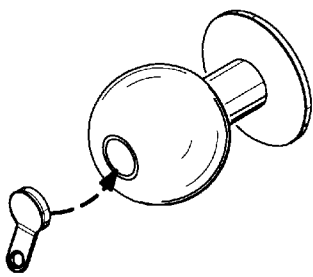
FIG. 45 shows an alternative package in the knob form.

Likewise, an alternate preferred embodiment can be achieved. This embodiment provides, in addition to the features of the above embodiment up to 127 user keys, manual or computer aided rekeying with master keys or rekeying tools, provides an audit trail with time stamp of last 100 transactions, direct connection to MICROLAN™ for wired systems, supports auxiliary inputs (RS-232 or custom). In addition to the components shown in FIG. 30 and described in reference thereto also provides a MICROLAN™ network connection. As described above in reference to FIG. 1 and in great detail in pending patent application Ser. No. 07/725,793, the MICROLAN™ . . . FIG. 32, 33, and 34 show a block schematic diagram of the electronics 2519 found in FIG. 30 and 31 respectively. In particular FIG. 32 shows electronics 2519 electrically coupled to first and second contacts 2505 and 2507, MICROLAN™ port 2535, 1-Wire™ port to internal memory, and peripheral interface, which shows the flexibility of the input/output to electronics 2519. In particular, it is important to note that the input/output ports can be configured to support any one of the ports shown, such as the 1-Wire™ port can be reconfigured to a 3-wire port to enable the use of a MICROLAN™ with a DS2404, another product manufactured and available from Dallas Semiconductor Corporation, the data sheet of which is herein incorporated by reference. The schematic shown in FIGS. 40 and 4133 shows that electronics 2519 can support a variety of expansion options. The base electronics package adds features by attaching them to either the internal 1-Wire™ port, the peripheral interface (which contains a UART) and a MICROLAN™.

Figure 36:
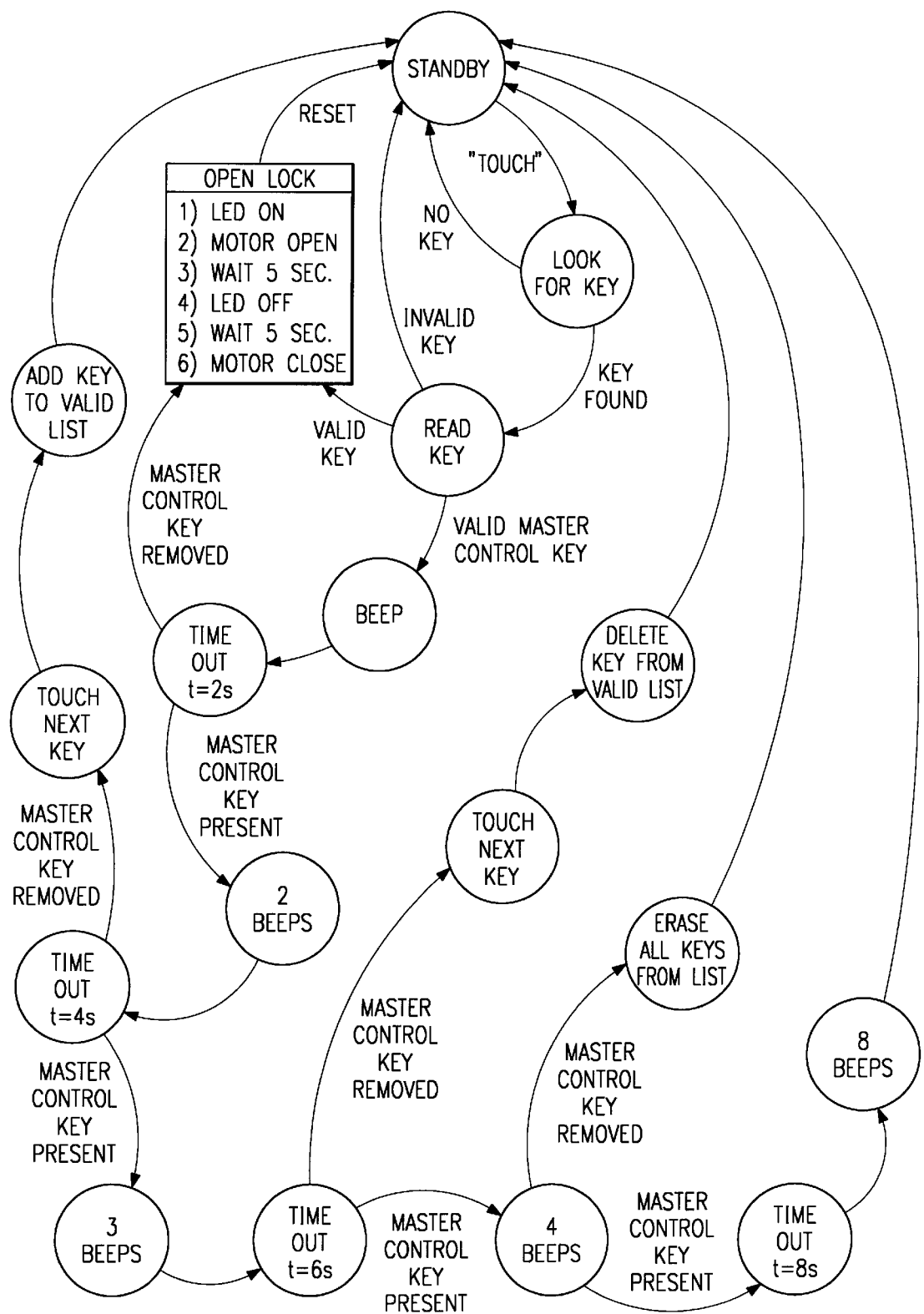
FIG. 36 shows an operational state diagram for using a Master Control Key for an alternate preferred embodiment.
Figure 37:
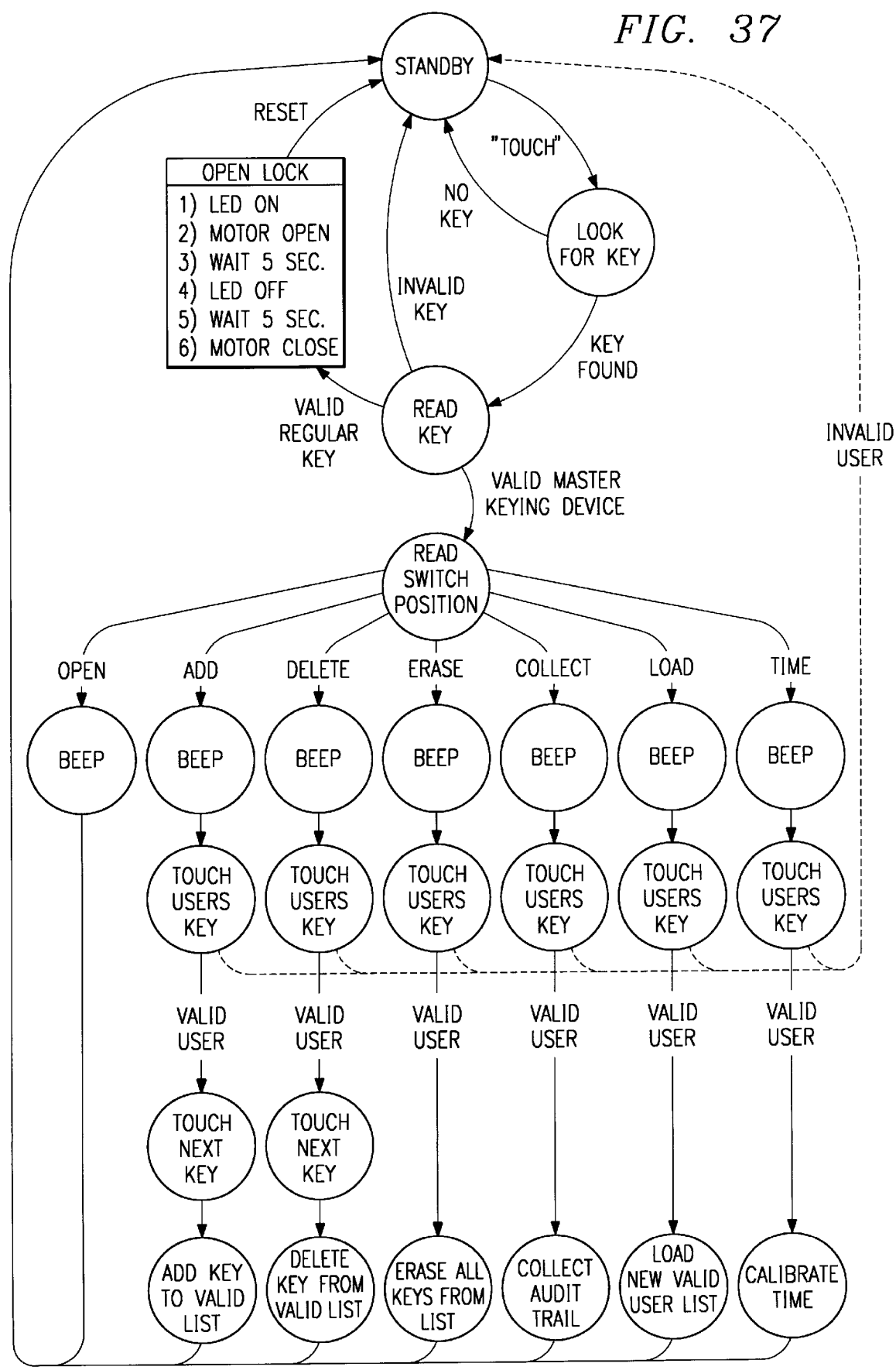
FIG. 37 shows an operational state diagram for using a computer aided key management system and Master Key Device for an alternate preferred embodiment.

In addition to the detailed discussion above regarding a preferred operation of the electrical lock and the key management system, state diagrams of alternate embodiments of the operating procedure using an entry key and the operating procedure for using a Master Control key or master keying device are shown in FIGS. 35, 36, and 37 respectively.

Figure 38:
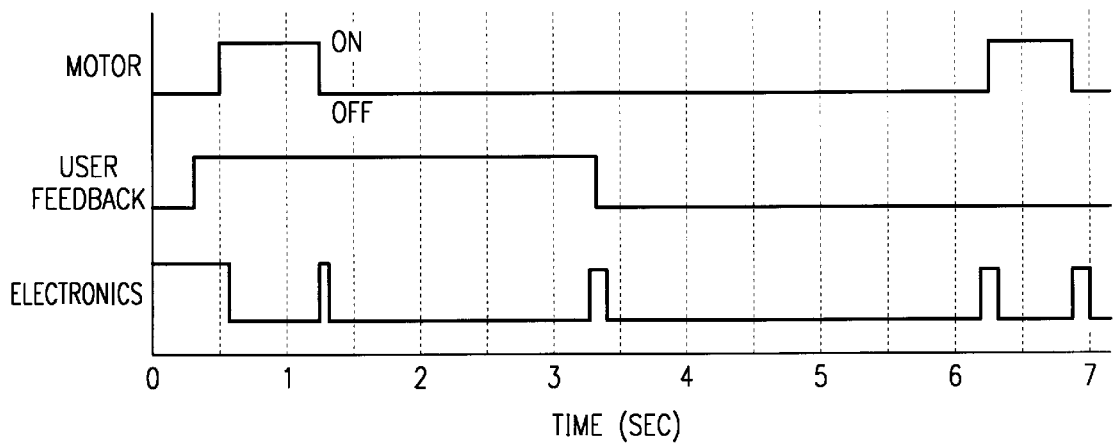
FIG. 38 show power management cycle timing and relative power consumption of the alternate preferred embodiment.
Figure 39:
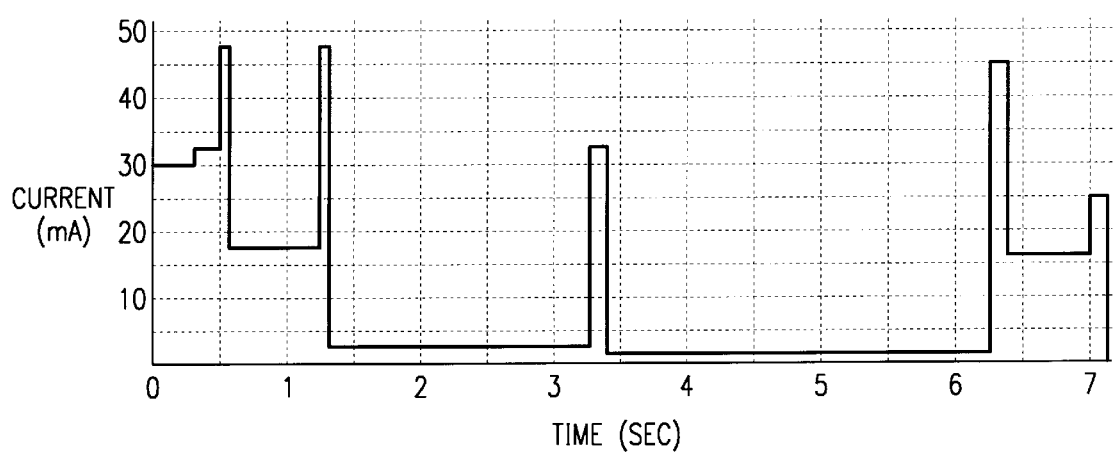
FIG. 39 shows the total power consumption profile of the preferred alternate preferred embodiment when using the power management feature.

As discussed above, FIG. 35 shows an operational state diagram for using an electrical entry key for an alternate preferred embodiment. Note, the operational step shown within the box "Open Lock" can change is sequence and duration via software to satisfy the end use requirements. Once again, using the electrical access methods discussed above is very similar to using an ordinary mechanical door lock. Electrical key 2A (in FIG. 1) and 2502A (in FIG. 25) and 2602A (in FIG. 26) is presented to the locks. The difference with between a mechanical lock and the electrical lock is that preferred embodiments of the electrical key only need to make a brief contact with the key way and do not require insertion and, if an electrical motor is included in the cylinder, no rotation. The orientation and alignment issues associated with mechanical keys is reduced to the simple motion of a "touch." To open the lock, briefly touch the Entry key to the key way. A single click will be felt if the key is a valid key. Then the lock will open and remain open for a predetermined amount of time. The lock then automatically wall relock and return to the stand-by mode. A processor controls the lock through its four operational modes: Stand-by, Look for Key, Read key and Open/Close. The lock resides in Stand-by to conserve the maximum amount of energy. When activity is detected at the key way, the lock processor determines if an electrical key is present. If a key is not present, the processor will return to Stand-by. However if a key is detected, the processor checks to see if it is a valid entry key (or a Master Control Key or a Master Keying Device). If the lock processor finds a valid Entry key, the motor is energized to open the latch mechanism. The latch is left open for some period of time and then motor is re-energized until the latch is closed. The lock electronics will control the motor and user feed back in such a way to always conserves energy. It will operates at full power only when necessary. When applicable, the electronics will turn on the motor or user feed back and then go into standby mode for some specified time or until a specific event has occurred. For example at T=O the electronics will turn on to see if a key is present. If key is present, it will ready the key. If it is a valid key, the user feed back will be turned on, at T=0.3 S. This will acknowledge the user that the key is valid and the lock is opening. At T=0.5 S the electronics will turn on the motor to disengage the locking mechanism. Since the motor and LFD will remain on for some time, the electronics will then go into stand by mode at T=0.51 to conserve power. Then at T=1.25 the electronics will turn back on and shut off the motor. This same process of using the electronics and then putting in stand by mode is repeated as required for the rest of the opening operation. FIG. 38 shows the sequencing of power to the motor, user feedback and lock electronics which minimize overall power consumption. FIG. 39 shows the total power consumption of the lock when using the power sequencing shown in FIG. 38.

As discussed above, FIG. 36 shows an operational state diagram for using a Master Control Key for an alternate preferred embodiment, which provides for enhanced key management. Note the security of an electrical lock is only good as long as the valid user list is kept current. Lost keys that belong to people which no longer have the need for access must be taken off the valid user list as soon as possible. Also new keys must be programmed into the lock with minimal effort. Key management for preferred embodiments of electrical locks can be done two ways, manually using a Master Control key or computer aided using Touch Key Management Software and the Master Keying Device.

Regarding the use of a Master Control Key, for applications with a small number of users and electronic locks, a Master Control key is ideal. A Master Control key can perform six functions: Open, Add a key, Delete a key, Erase all keys, Hold open and Extract the core. The MCK must be as easy to use as an Entry key and be as inexpensive. The six functions of the MCK are described in the following paragraphs.

1. To Open a lock, briefly touch the MCK to the key way. A single click will be felt. This acknowledges a valid key and the lock will open for a set period and then will reset itself. An invalid key will have no acknowledgment.

2. To ADD a key to the lock, touch the MCK to the lock key way until two (2) clicks are felt, then remove the key. The next key touched to the key way will be added to the valid key list. To verify the keys entry, retouch the key to the key way and the lock should open.

3. To DELETE a key from the lock, touch the MCK to the lock key way until two (3) clicks are felt, then remove the key. The next key touched to the key way will be deleted from the valid key list. To verify the keys removal from the list, retouch the old entry key to the key way and the lock should not open.

4. For lost keys, the user list must first be erased and then re-entered, including the replacement key. To ERASE the valid user list, touch the MCK to the lock key way until four (4) clicks are felt, then remove the key. This cleared out the valid user list and only the MCK will operate the lock. Then re-enter the valid user list as described in the previous step.

5. To have the lock remain in the HOLD open position, touch the MCK to the lock key way until eight (8) clicks are felt, then remove the MCK for no more than 2 seconds. The MCK is then retouched to the lock key way until eight (8) more clicks are felt. This will set the lock into the hold open position. To clear this setting and have the lock reset, simply touch the MCK to the key way until a signal click is felt.

6. To Extract the lock core, touch the MCK to the key way until eight (8) clicks are felt, then remove the MCK for more than 5 seconds The MCK is then retouched to the lock keyway until two (2) sets of four (4) clicks are felt then the MCK. This will retract the retaining pin in the core and will enable it to be pulled from the lock. If the MCK is left in contact with the key way for more the two (2) seconds, the lock will reset to the normal operation mode.

The above process is shown in graphic format in FIG. 36. It contains all of the editing functions for the Master Control key.

For larger applications, where there is a large number of users and many lock, key management is best accomplished with the aide of a PC. All of the preferred embodiments of the electrical locks and the PC will then operate as a system. The PC will act as the computer host for this system and will control the rekeying process.

The data entry and computing power of the PC will be used to create a data base that contains a list of each users name which will be matched to their key's registration number. The data base will also contain a reference list of registration numbers of those door locks the user has access. (Each lock has a registration number that uniquely identifies it.) This updated data base is loaded into a Master Keying Device, which is taken to each door that requires rekeying. The procedure for rekeying a lock with an MKD will be secure and not to let the user carrying the MKD to program the wrong lock.

Figure 46A:
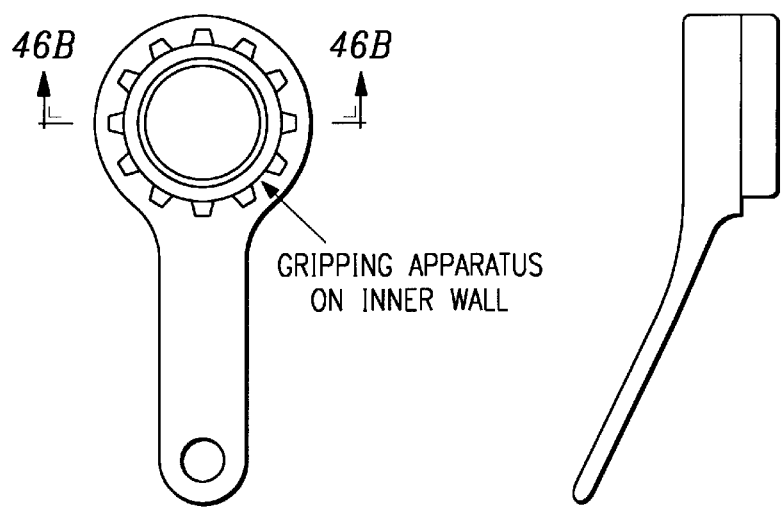
FIG. 46A shows the front and side view of key having preferred gripping apparatus that interlocks with the key to provide a mechanism in which energy can be transferred from a human being using the key to the withdraw a latch, after it has been unlocked, in order to open the lock to open a door.
Figure 46B:
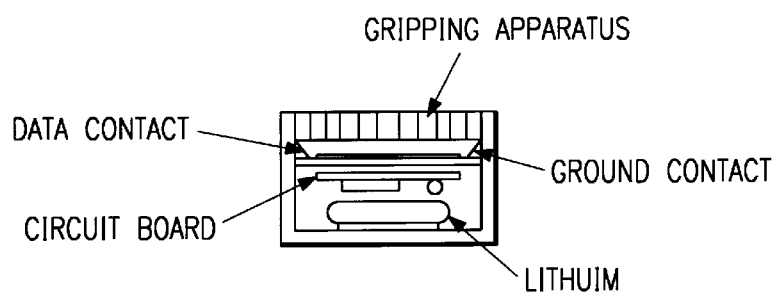
FIG. 46B shows the internal circuit board showing the preferred electronic circuitry of the key shown in FIG. 46A, which is comprised of a microprocessor, an energy source, and nonvolatile memory.
Figure 46C:
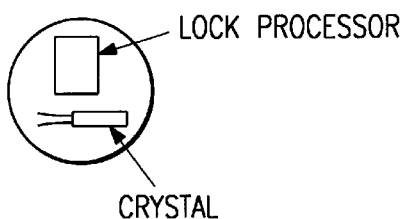
FIG. 46C shows the assembly drawing of key having a microprocessor, an energy source, and non-volatile memory in preferred circuitry.
Figure 47A:
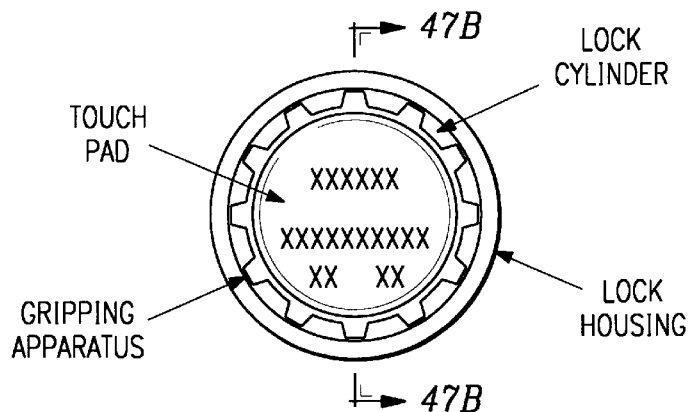
FIG. 47A shows the front view of key having gripping apparatus that interlocks with the key to provide a mechanism in which energy can be transferred from a human being using the key to the withdraw a latch, after it has been unlocked, in order to open the lock to open a door.
Figure 47B:
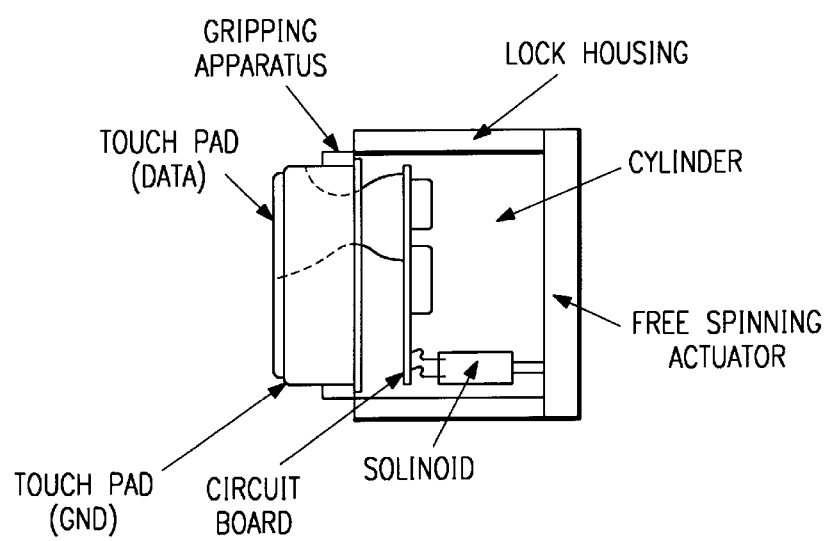
FIG. 47B shows the sectional view A—A of the key shown in FIG. 47A.
Figure 47C:
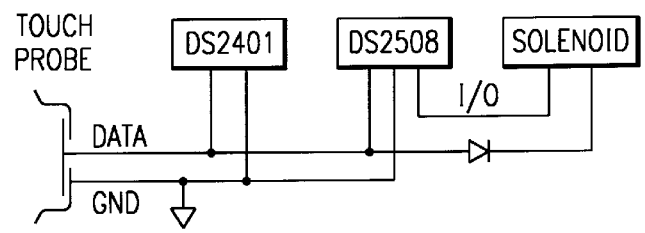
FIG. 47C show the block circuit schematic diagram of preferred electronics used in key shown in FIGS. 46A, 46B, 46C, 47A, and 47B.

Regarding gripping apparatus, FIGS. 46A and 47A also show gripping apparatus that interlocks with the key to provide a mechanism in which energy can be transferred from a human being using the key to the withdraw a latch, after it has been unlocked, in order to open the lock to open a door. More specifically, preferred embodiments have self contained electronics and power source. The electronics in the gripping apparatus contain an intelligent controller and memory. This memory contains a list of those locks which it will operate. When the key is brought into contact with the lock, the circuitry within the gripping apparatus powers and communicates with the lock. The identity of the lock is obtained and the decision to allow entry is made. If entry is authorized, the key commands the lock to energize its electromechanical interface allowing the key to rotate the cylinder of the lock. The memory found in the lock can store an exclusive list of authorized keys and other relevant data.

The lock cylinder is free spinning with respect to the lock housing, and the pinion gear. To operate the lock, the cylinder is coupled to the pinion gear via the electromechanical interface. Then the rotation of the cylinder also rotates the pinion gear. This gear is mechanically linked to a rack which acts as the latching mechanism. When the cylinder is rotated, the latching mechanism is withdrawn.

Figure 48:
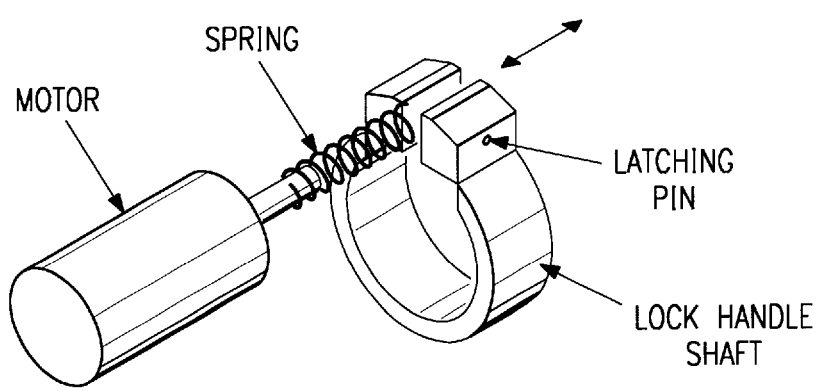
FIG. 48 show a spring coupled motorized latch that can be used to actuate the locking mechanism.

FIG. 48 show a spring coupled motorized latch that can be used to actuate the locking mechanism. Note the motor turns the grooved shaft. The spring lays in the shaft and rotates up and down the length of the shaft. The spring is attached to a latching pin. As the spring rides down the shaft in groove tension in spring pulls/pushes the latching pin in/out of the lock handle shaft. Finally, when the latching pin is moved out of the slot in the lock handle shaft, the shaft handle is free to rotate to withdraw a latch used to secure the door. The entire assembly shown in FIG. 48 can be inserted into the lock cylinders used to actuate the latch used to lock a door.

Further Modifications and variations

Regarding the Touch Memory™ module, it is important to recognize that preferred embodiments of the electrical/mechanical access control systems and methods utilize Touch Memory™ technology in the key and lock itself, which has been described in great detail in the patents and patent applications listed above, which are hereby incorporated by reference. Relevant portions of these patents and patent applications are repeated here to provide a thorough and complete explanation of the preferred embodiment of the electrical/mechanical access control systems and methods.

It will be recognized by those skilled in the art that the innovative concepts disclosed in the present application can be applied in a wide variety of contexts. Moreover, the preferred implementation can be modified in a tremendous variety of ways. For instance, it well within the scope of this invention to remove the circuitry (e.g., preferably embedded in an integrated circuit) from the Touch Memory™ module and affix or, otherwise, position it on card, a conductive, mechanical key, a ring, etc. In short, the circuitry embedded in the integrated circuit is key and can be packaged in a variety of ways that still permit the circuitry to be electrically coupled with additionally circuitry used to directly or indirectly activate locking mechanism. Accordingly, it should be understood that the modifications and variations suggested below and above are merely illustrative. These examples may help to show some of the scope of the inventive concepts, but these examples do not nearly exhaust the full scope of variations in the disclosed novel concepts.

What is claimed is:

1. An access control system, comprising;
a retro-fit electromechanical door handle assembly adapted to be similar in appearance and to replace an existing mechanical door handle assembly on a door, said retro-fit electromechanical door handle assembly comprising;
a locking mechanism including a motor mechanically coupled to a latch mechanism for locking and unlocking the latch mechanism, thereby locking and unlocking the door, and
a door handle having an electrical key insert means and a mechanical key insert means, wherein the electrical key insert means has a data probe on an exterior location of the door handle for communicating with an electrical key and the electrical key insert means is for activating the motor to unlock the locking mechanism upon contact of an authorized electrical key with the data probe independently of a mechanical key and independently of the mechanical key insert means, and the electrical key insert means is provided with a gripping means on an exterior portion of the data probe for engagement with an electrical key, allowing the key to be used to turn the handle to withdraw the latch of the locking mechanism after it has been unlocked.

2. The access control system of claim 1, wherein the electronic key insert means comprises:

a touchable memory device.

* * * * *